(12) United States Patent
Roh et al.

(10) Patent No.: US 8,048,758 B2
(45) Date of Patent: Nov. 1, 2011

(54) METHOD FOR FABRICATING A CAPACITOR UTILIZES THE SACRIFICIAL PATTERN COVERING THE CELL REGION

(75) Inventors: Jae-Sung Roh, Ichon-shi (KR);
Kee-Jeung Lee, Ichon-shi (KR);
Han-Sang Song, Ichon-shi (KR);
Seung-Jin Yeom, Ichon-shi (KR);
Deok-Sin Kil, Ichon-shi (KR);
Young-Dae Kim, Ichon-shi (KR);
Jin-Hyock Kim, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 13/069,294

(22) Filed: Mar. 22, 2011

(65) Prior Publication Data

US 2011/0171808 A1    Jul. 14, 2011

Related U.S. Application Data

(62) Division of application No. 11/772,034, filed on Jun. 29, 2007, now Pat. No. 7,910,452.

(30) Foreign Application Priority Data

Oct. 2, 2006 (KR) .................. 10-2006-0097312

(51) Int. Cl.
*H01L 21/20* (2006.01)

(52) U.S. Cl. ............... 438/397; 438/254; 257/E21.648

(58) Field of Classification Search .................. 438/254, 438/397; 257/E21.648
See application file for complete search history.

(56) References Cited

U.S. PATENT DOCUMENTS

| 7,053,435 | B2 | 5/2006 | Yeo et al. | |
| 7,153,740 | B2 | 12/2006 | Kim et al. | |
| 7,525,143 | B2 * | 4/2009 | Chae | 257/306 |
| 7,544,563 | B2 * | 6/2009 | Manning | 438/253 |
| 7,723,202 | B2 | 5/2010 | Eto | |
| 7,728,376 | B2 * | 6/2010 | Matsui et al. | 257/310 |

FOREIGN PATENT DOCUMENTS

| KR | 1020050045608 A | 5/2005 |
| KR | 2005-0055077 | 6/2005 |
| KR | 1020060068199 A | 6/2006 |

* cited by examiner

*Primary Examiner* — Thanh V Pham
(74) *Attorney, Agent, or Firm* — Kilpatrick Townsend & Stockton LLP

(57) ABSTRACT

A method for fabricating a capacitor includes forming an isolation layer over a cell region and a peripheral region of a substrate. The isolation layer forms a plurality of open regions in the cell region. Storage nodes are formed on surfaces of the open regions. A sacrificial pattern is formed over the isolation layer and covers the cell region. The isolation layer is etched in the peripheral region to expose side portions of the resulting structure obtained after forming the sacrificial pattern in the cell region. With the sacrificial pattern supporting the storage nodes, the isolation layer in the cell region is removed. The sacrificial pattern is then removed.

11 Claims, 45 Drawing Sheets

METHOD FOR FABRICATING A CAPACITOR UTILIZES THE SACRIFICIAL PATTERN COVERING THE CELL REGION

CROSS-REFERENCE TO RELATED APPLICATIONS

The present invention is a divisional of U.S. patent application Ser. No. 11/772,034, filed on Jun. 29, 2007, now U.S. Pat. No. 7,910,452, which claims priority of Korean patent application number 10-2006-0097312, filed on Oct. 2, 2006, both of which are incorporated by reference in their entirety.

BACKGROUND OF THE INVENTION

The present invention relates to a method for fabricating a semiconductor device, and more particularly, to a method for fabricating a cylinder type capacitor.

A memory cell size has continuously decreased as the design rule of dynamic random access memories (DRAM) also decreases. Accordingly, the height of a capacitor has continuously increased and the thickness has become smaller in order to maintain a desired charge capacitance. The height has increased and the thickness has decreased because the charge capacitance is proportionate to the surface area of an electrode and the dielectric constant of a dielectric layer, and is inversely proportionate to the distance between the electrodes, i.e., the thickness of the dielectric layer.

FIGS. 1A and 1B illustrate cross-sectional views of a conventional method for fabricating a capacitor. A line A-A' represents a cross-sectional view of a substrate structure having a zigzag arrangement with a small spacing distance. A line B-B' represents a cross-sectional view of the substrate structure having a zigzag arrangement with a large spacing distance.

Referring to FIG. 1A, an insulation layer 12 is formed over a semi-finished substrate 11. Stack structures, including storage node contact plugs 13 and barrier metals 14, are formed in the insulation layer 12. An etch stop layer and a sacrificial layer are formed over the insulation layer 12 including the stack structures. The sacrificial layer and the etch stop layer are etched to form a patterned sacrificial layer 16 and a patterned etch stop layer 15 thereby defining open regions. Cylinder type storage nodes 17 are then formed on the surface of the open regions. The open regions have a certain aspect ratio. The aspect ratio is a ratio of a bottom critical dimension 'W' to a height 'H' of the open regions.

Referring to FIG. 1B, a wet dip out process is performed to remove the patterned sacrificial layer 16. Thus, inner walls and outer walls of the cylinder type storage nodes 17 are exposed. However, as the design rule continuously decreases, a distance between cylinder type storage nodes has also decreased in the cylinder type capacitor formation process. Thus, generation of bridges between neighboring storage nodes is increased despite the optimization of the wet dip out process.

FIG. 1C illustrates a graph showing the probability of bridge generation according to different aspect ratios of storage nodes. For instance, when a ratio between the bottom critical dimension 'W' to the height 'H' of the storage nodes in FIG. 1A is larger than 12, the storage nodes may lean and cause neighboring storage nodes to stick together, thereby generating bridges.

FIG. 1D illustrates a micrographic view of storage nodes without bridge generation. FIG. 1E illustrates a micrographic view of storage nodes with bridge generation. In FIG. 1D, an aspect ratio is 12, and the storage nodes are arranged with a uniform spacing distance. In FIG. 1E, an aspect ratio is 17, and the storage nodes lean and stick together.

The value of the aspect ratio causing the leaning may be variable according to the property or thickness of the electrode and according to dry conditions of the sacrificial layer after performing a wet etching for forming the cylinders. The undesirable results shown in FIG. 1E generally occur when the aspect ratio is larger than 14 for a titanium nitride (TiN) electrode.

The leaning may be caused by the surface tension of water existing between the storage nodes during a dry process which is performed after the wet dip output process. As the DRAM becomes smaller, the height of the capacitor may need to be increased accordingly to maintain the surface area of the capacitor. However, the height of the capacitor generally needs to be decreased in order to keep the aspect ratio below a certain level and reduce the bottom critical dimension increase. Thus, it may be difficult to maintain a sufficient surface area. Accordingly, an effective thickness of the dielectric layer may need to be reduced in order to maintain a satisfactory capacitance because of an insufficient capacitor surface area.

SUMMARY OF THE INVENTION

Embodiments of the present invention are directed to a method for fabricating a capacitor in a semiconductor device, which can reduce leaning of storage nodes during a dry process after a wet dip out process is performed.

In accordance with an aspect of the present invention, a method for fabricating a capacitor is provided. An isolation layer is formed over a substrate. The isolation layer defines a plurality of open regions. Storage nodes are formed on surfaces of the open regions. An upper portion of the isolation layer is etched to expose upper outer walls of the storage nodes. A sacrificial layer is formed over the isolation layer to enclose the upper outer walls of the storage nodes. The isolation layer and the sacrificial layer are then removed.

In accordance with another aspect of the present invention, a method for fabricating a capacitor is provided. An isolation layer is formed over a cell region and a peripheral region of a substrate. The isolation layer defines a plurality of open regions in the cell region. Storage nodes are formed on surfaces of the open regions. An upper portion of the isolation layer is etched to expose upper outer walls of the storage nodes. A sacrificial pattern is formed on the isolation layer to cover the cell region. The isolation layer is etched in the peripheral region to expose side portions of the resultant structure obtained after forming the sacrificial pattern in the cell region. The isolation layer in the cell region and the sacrificial pattern are then removed.

In accordance with still another aspect of the present invention, a method for fabricating a capacitor is provided. An isolation layer is formed over a cell region and a peripheral region of a substrate. The isolation layer defines a plurality of open regions in the cell region. The substrate comprises the cell region and the peripheral region. Storage nodes are formed on surfaces of the open regions. A sacrificial pattern is formed on the isolation layer to cover the cell region. The isolation layer is etched in the peripheral region to expose side portions of the resultant structure obtained after forming the sacrificial pattern in the cell region. The isolation layer in the cell region and the sacrificial pattern are removed.

In accordance with still another aspect of the present invention, a method for fabricating a capacitor is provided. An isolation layer is formed over a cell region and a peripheral region of a substrate. The isolation layer defines a plurality of open regions in the cell region. Storage nodes are formed on surfaces of the open regions. An upper portion of the isolation layer is etched to expose upper outer walls of the storage nodes. A sacrificial pattern is formed over the isolation layer. The sacrificial pattern encloses the upper outer walls of the storage nodes. The isolation layer in the peripheral region is etched to expose side portions of the resultant structure obtained after forming the sacrificial pattern. The isolation layer in the cell region and the sacrificial pattern are removed.

DESCRIPTION OF SPECIFIC EMBODIMENTS

The present invention relates to a method for fabricating a capacitor. In accordance with some embodiments of the present invention, the likelihood of leaning of storage nodes generated during a wet dip out process and a dry process, which are essential in forming cylinder type storage nodes, may be reduced by forming sidewalls on upper outer walls of the storage nodes. Furthermore, using an amorphous carbon layer may allow fabrication of the capacitor without deteriorating a production yield because the amorphous carbon layer may be easily removed through a dry ashing process after the cylinder type storage nodes are formed.

FIGS. 2A to 2H illustrate cross-sectional views of a method for fabricating a cylinder type capacitor according to a first embodiment of the present invention. A line A-A' represents a cross-sectional view of a substrate structure having a zigzag arrangement with a small spacing distance. A line B-B' represents a cross-sectional view of the substrate structure having a zigzag arrangement with a large spacing distance.

Figure 1A:
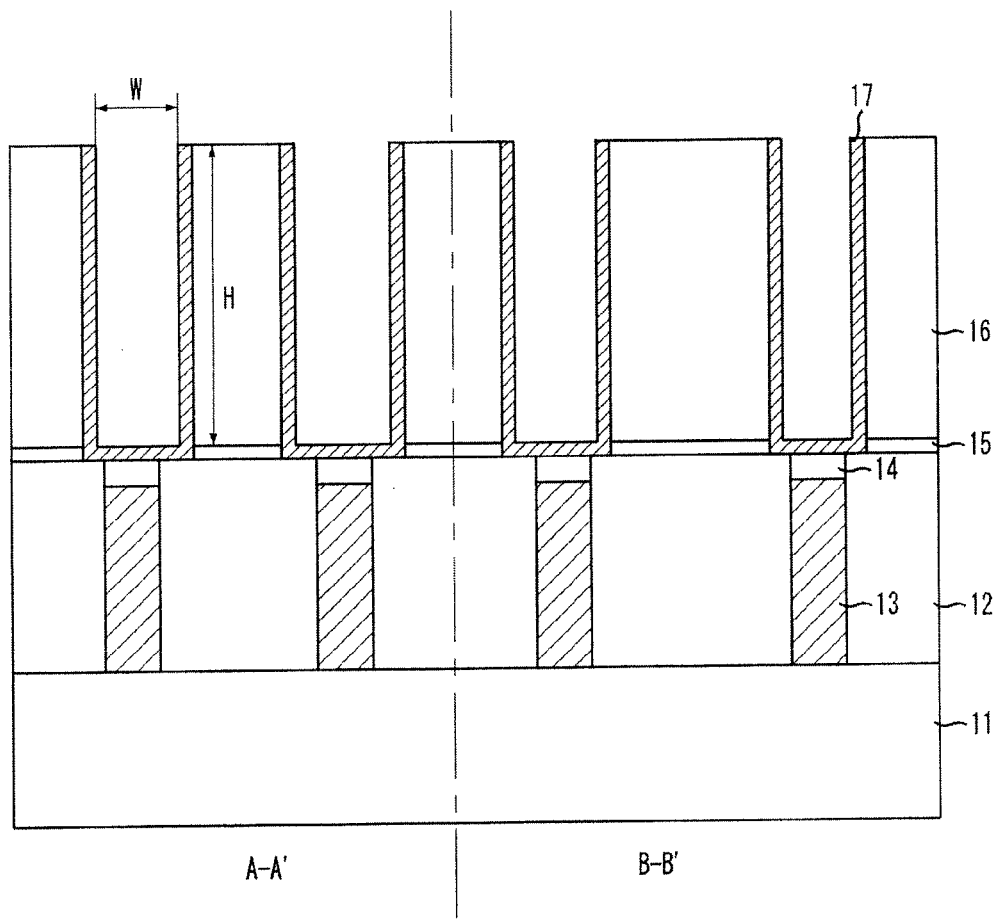
FIGS. 1A and 1B illustrate cross-sectional views of a conventional method for fabricating a capacitor.
Figure 1A:
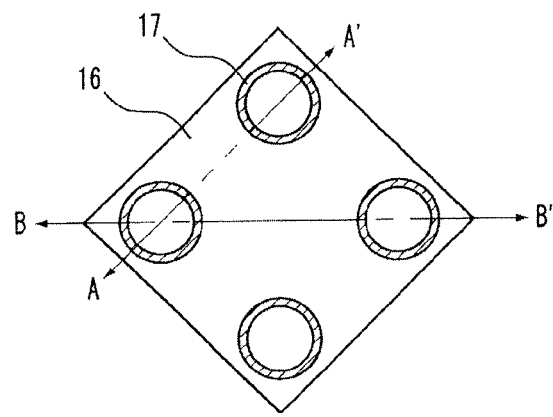
Figure 1B:
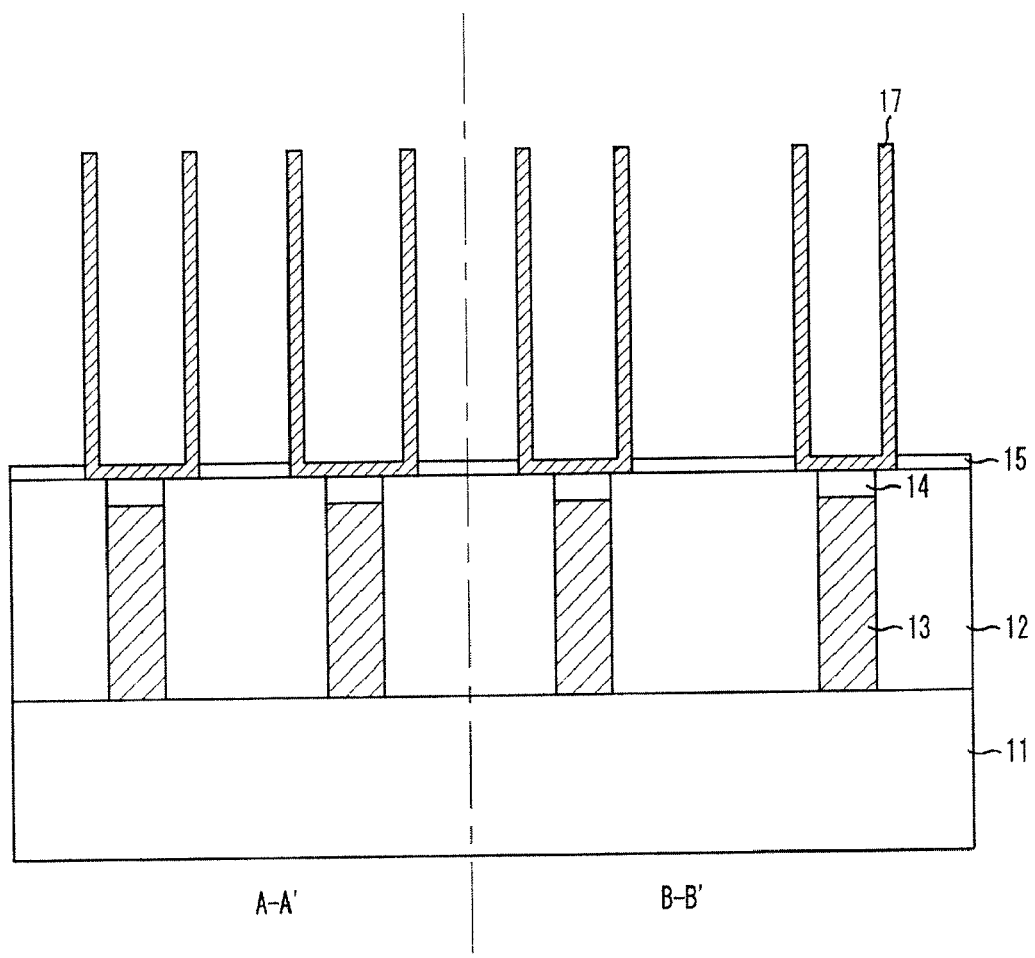
Figure 1C:
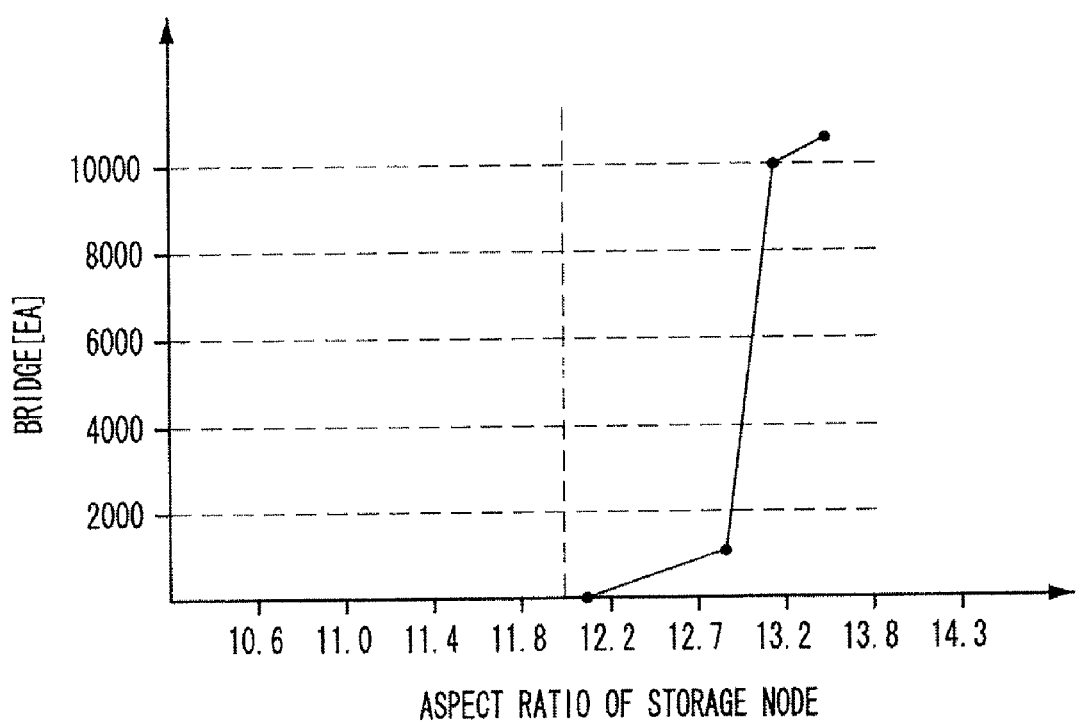
FIG. 1C illustrates a graph showing probabilities of bridge generation according to aspect ratios of conventional storage nodes.
Figure 1D:
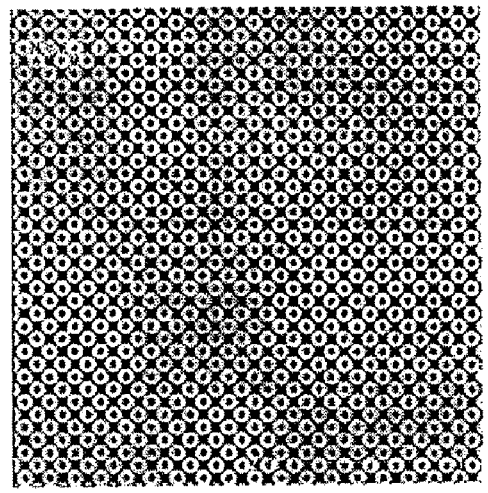
FIG. 1D illustrates a micrographic view of storage nodes without bridge generation.
Figure 1E:
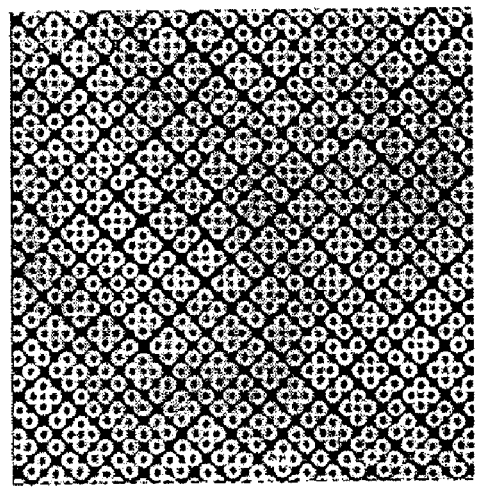
FIG. 1E illustrates a micrographic view of storage nodes with bridge generation.
Figure 2A:
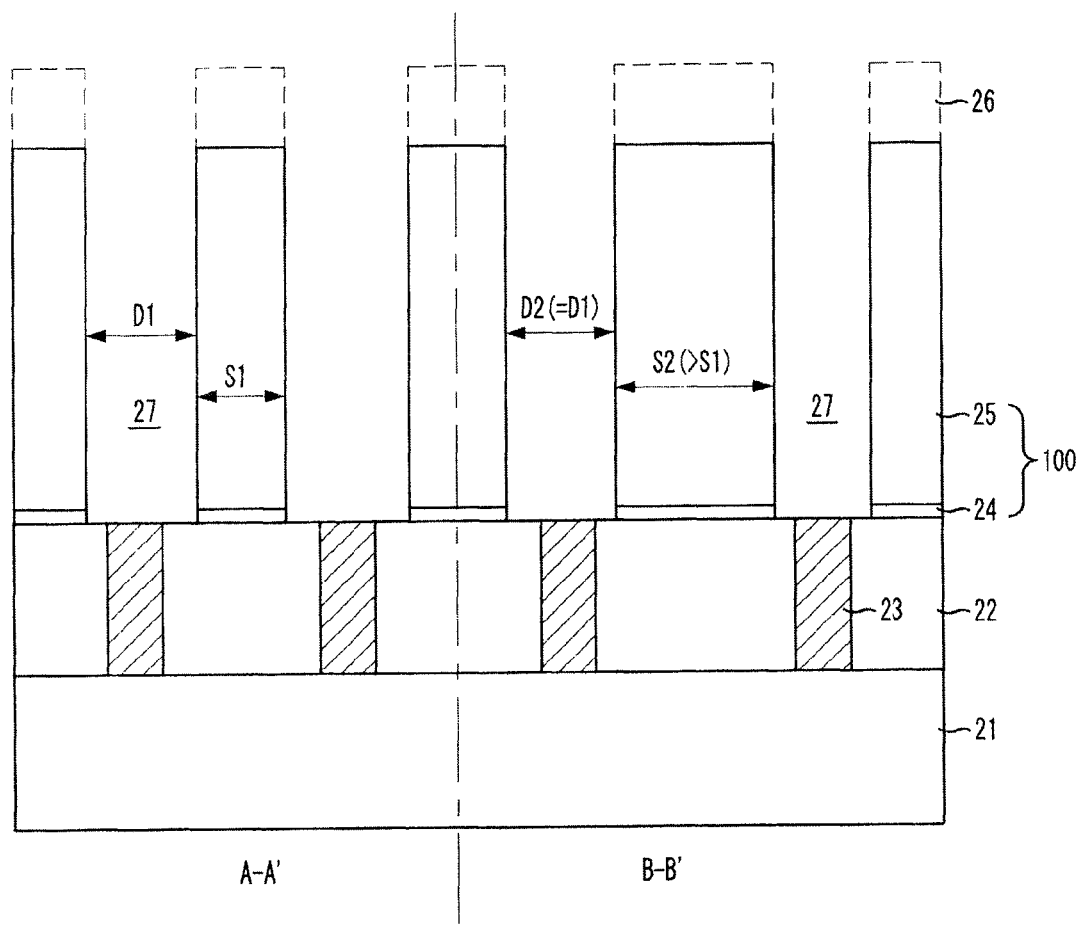
FIGS. 2A to 2H illustrate cross-sectional views of a method for fabricating a cylinder type capacitor according to a first embodiment of the present invention.

Referring to FIG. 2A, an insulation layer 22 is formed over a semi-finished substrate 21. Storage node contact holes are formed in the insulation layer 22, and storage node contact plugs 23 are formed in the storage node contact holes. Although not illustrated, processes for forming transistors, word lines, and bit lines are generally performed before forming the insulation layer 22. The insulation layer 22 may include an undoped silicate glass (USG) layer and may be formed to have a thickness ranging from approximately 1,000 Å to approximately 3,000 Å. A patterned etch stop layer 24 is formed over the insulation layer 22. A patterned mould layer 25 is formed over the patterned etch stop layer 24.

The insulation layer 22 is etched using a storage node contact mask to form the storage node contact holes. A polysilicon layer fills the storage node contact holes and an etchback process is performed to form the storage node contact plugs 23. Although not illustrated, barrier metals may be formed over the storage node contact plugs 23. The barrier metals may include titanium (Ti) or titanium nitride (TiN). An etch stop layer is formed over the insulation layer 22 and the storage node contact plugs 23. The etch stop layer may include a nitride-based material. For instance, the etch stop layer may include a silicon nitride ($Si_3N_4$) layer.

A mould layer is formed over the etch stop layer. The mould layer may include an insulation layer. For instance, an oxide-based layer such as a phosphosilicate glass (PSG) layer or a plasma enhanced tetraethyl orthosilicate (PETEOS) layer may be formed to a certain thickness sufficient to maintain a necessary surface area for a desired dielectric capacitance. The mould layer may be formed in a double-layer structure including oxide-based layers. The double-layer structure may be formed such that an upper oxide-based layer has a smaller etch rate in a wet etch solution for oxide than a bottom oxide-based layer. For example, PSG may be formed and PETEOS may then be formed over the PSG in the double-layer structure.

A photoresist layer is formed over the mould layer. A photo-exposure and developing process is performed on the photoresist layer to form a photoresist pattern 26. It is important for the photoresist pattern 26 to arrange openings in a zigzag pattern. The openings are arranged in the photoresist pattern 26 where subsequent storage nodes are to be formed. The mould layer is etched using the photoresist pattern 26 as an etch barrier to form the patterned mould layer 25 and to form a plurality of open regions 27. The etch stop layer exposed by the open regions 27 are etched to form the patterned etch stop layer 24 and to expose upper surfaces of the storage node contact plugs 23.

The open regions 27 are formed to have a trench shape. The open regions 27 are also referred to as storage node holes because the subsequent storage nodes are formed on the surface of the open regions 27. The open regions 27 are arranged in a zigzag pattern, mirroring the zigzag arrangement of the photoresist pattern 26. A stack structure, including the patterned etch stop layer 24 and the patterned mould layer 25 providing the open regions 27, is referred to as an isolation layer 100. The photoresist pattern 26 is then removed.

Figure 2B:
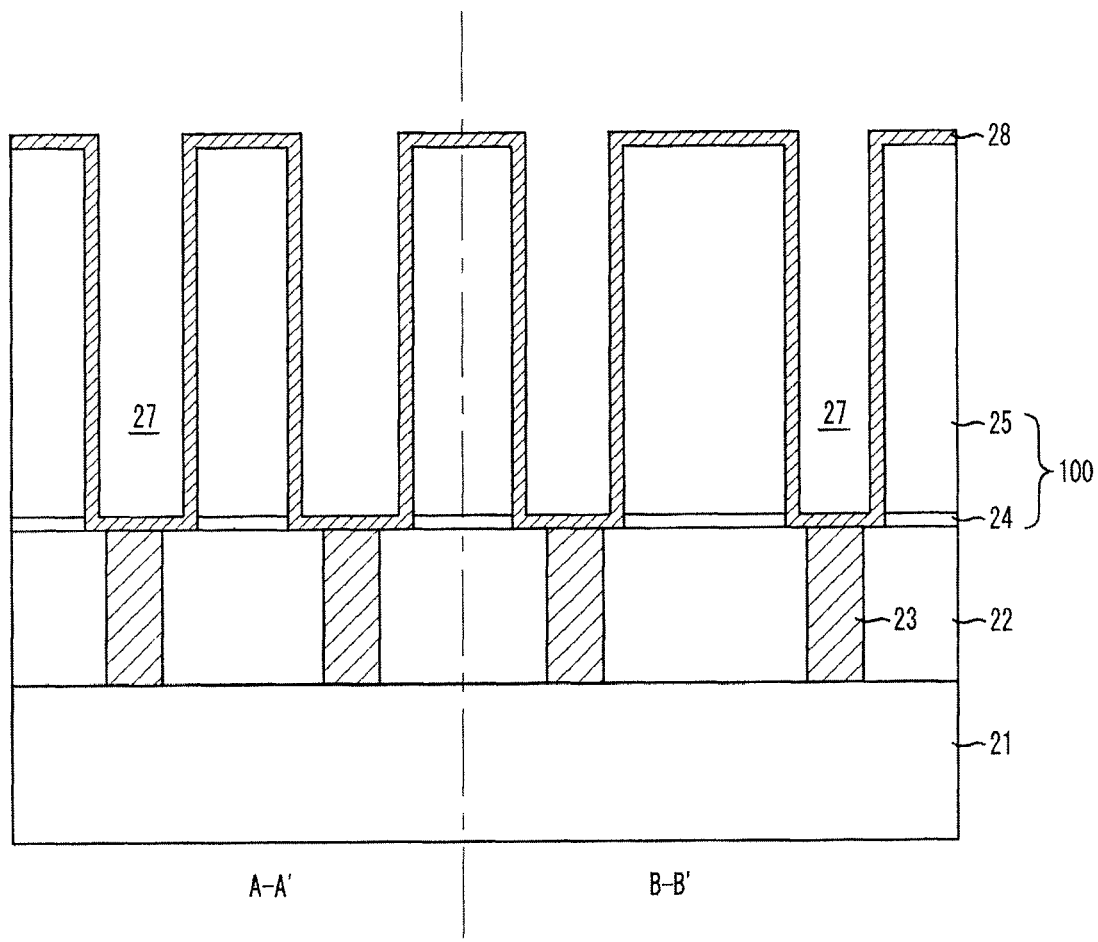

Referring to FIG. 2B, a conductive layer 28 for forming the storage nodes is formed over the isolation layer 100 and the open regions 27. The conductive layer 28 includes a metal electrode such as TiN or ruthenium (Ru). The conductive layer 28 may also include other materials besides TiN and Ru. The conductive layer 28 may be formed to have a thickness ranging from approximately 200 Å to approximately 400 Å using a chemical vapor deposition (CVD) method or an atomic layer deposition (ALD) method.

When forming the conductive layer 28 including TiN using the CVD method, a CVD TiN deposition method is performed using titanium tetrachloride (TiCl$_4$) as a source and using ammonia (NH$_3$) as a reaction gas at a temperature ranging from approximately 400° C. to approximately 700° C. When forming the conductive layer 28 including Ru, the ALD method or the CVD method is performed using Ru(EtCp)$_2$ as a source and using oxygen (O$_2$) gas as a reaction gas at a temperature ranging from approximately 200° C. to approximately 400° C. The conductive layer 28 for forming the storage nodes may include platinum (Pt) formed by the ALD method or iridium (Ir) formed by the ALD method.

Figure 2C:
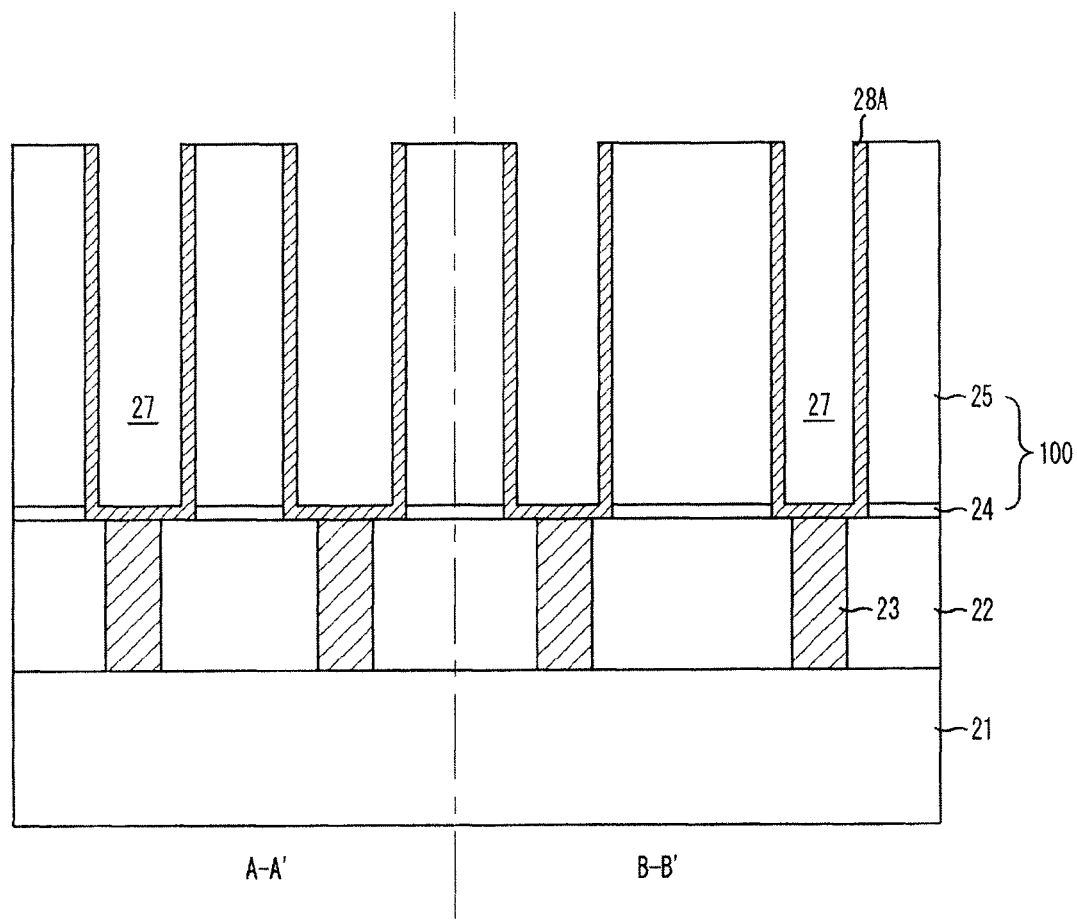

Referring to FIG. 2C, a storage node isolation process is performed. The storage node isolation process includes performing a dry etch-back process on the conductive layer 28. The storage node isolation process may include performing a CMP process or a dry etch-back process using a photoresist layer barrier or an oxide-based layer barrier when the conductive layer 28 includes TiN. Using the photoresist layer barrier or the oxide-based layer barrier may reduce contamination in the open regions 27 during the storage node isolation process.

The storage node isolation process is performed until top surfaces of the patterned mould layer 25 are exposed. Thus, cylinder type storage nodes 28A are formed on the surface of the open regions 27, isolated from each other. In other words, the CMP process or the dry etch-back process is performed to remove portions of the conductive layer 28 formed outside the open regions 27, thereby forming the cylinder type storage nodes 28A over bottom surfaces and sidewalls of the open regions 27.

Figure 2D:
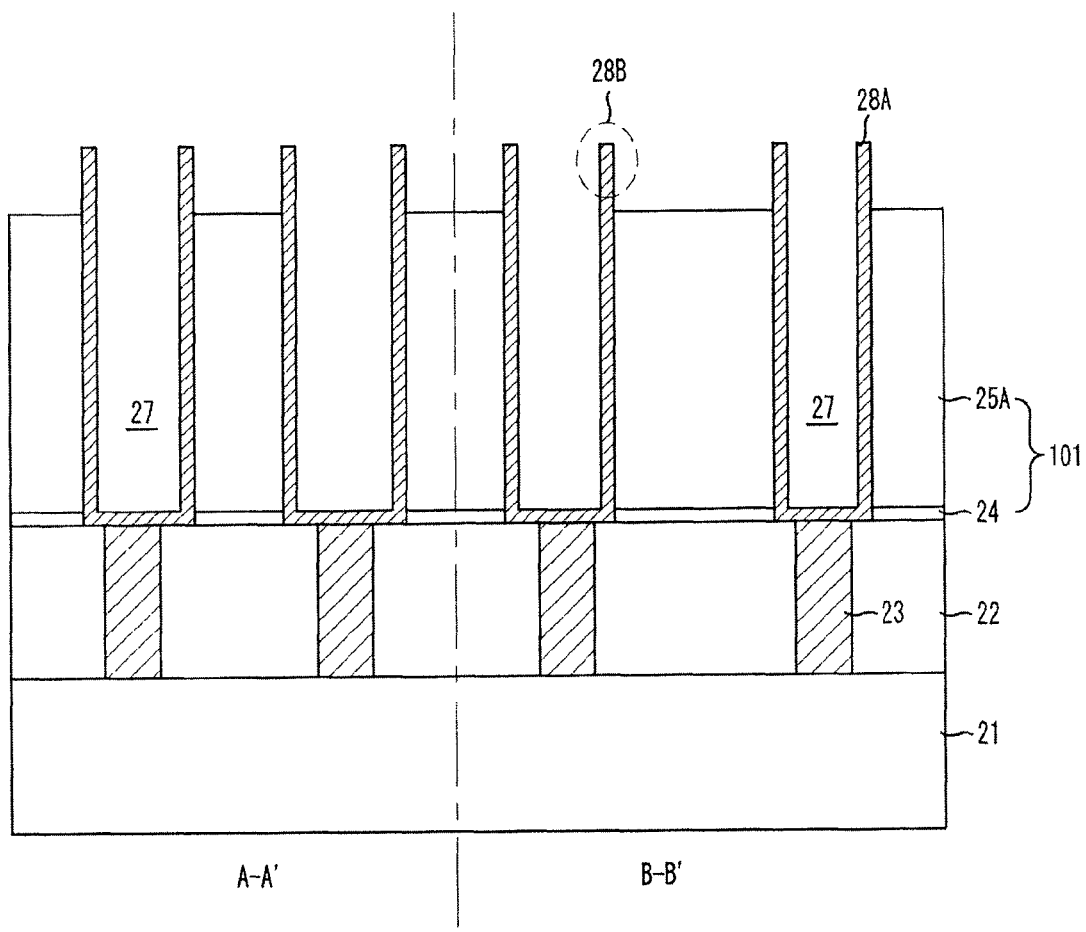

Referring to FIG. 2D, the patterned mould layer 25 is partially etched to form a remaining mould layer 25A. Thus, upper outer walls 28B of the storage nodes 28A are exposed. A remaining isolation layer 101 includes the remaining mould layer 25A and the patterned etch stop layer 24.

The patterned mould layer 25 is selectively etched using an oxide etchant because the patterned mould layer 25 includes an oxide-based material. For instance, a wet etch may be used. The wet etch may include performing a wet dip out process. The wet etch of the patterned mould layer 25 may include etching the patterned mould layer 25 to a thickness ranging from approximately 200 nm to approximately 1,000 nm using a buffered oxide etchant (BOE) or a hydrogen fluoride (HF) solution. For instance, approximately 700 nm to approximately 800 nm of the patterned mould layer 25 may be etched.

Figure 2E:
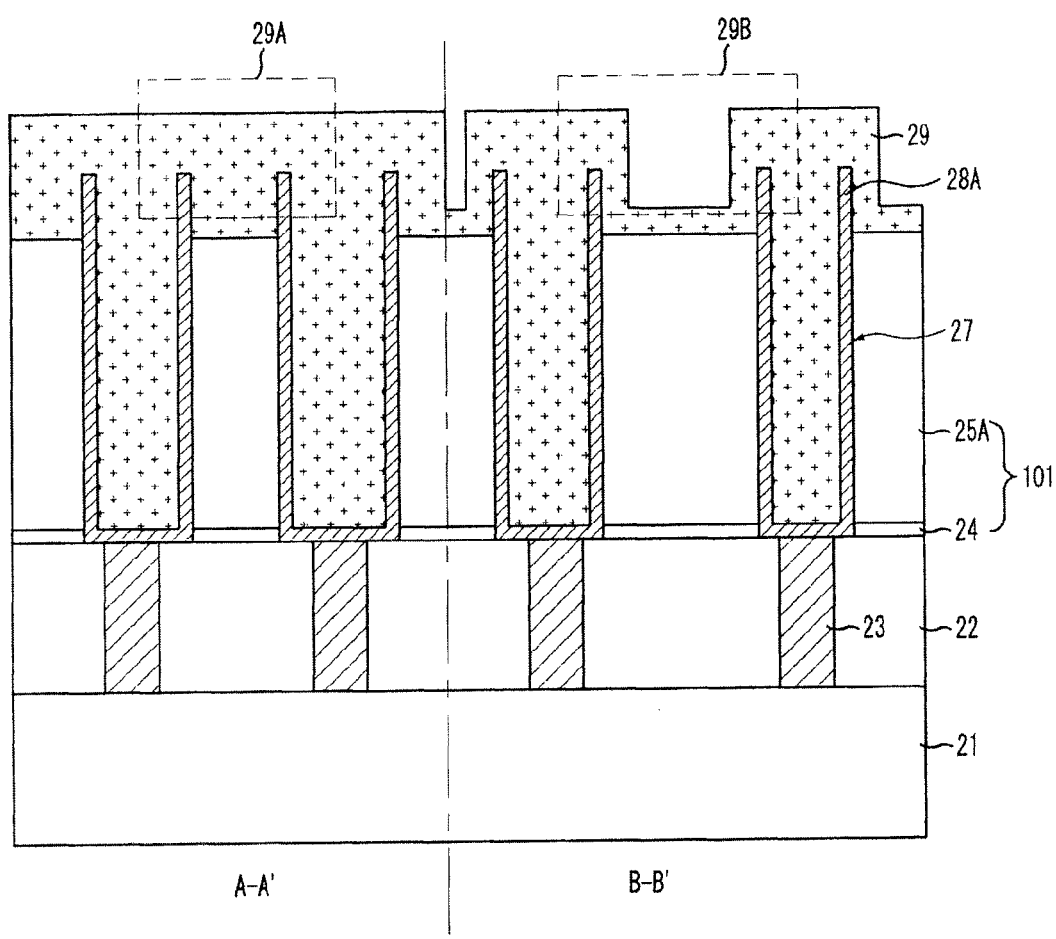

Referring to FIG. 2E, a sacrificial layer 29 is formed over the storage nodes 28A and the remaining isolation layer 101. The sacrificial layer 29 may include a material which may not be etched or which has a substantially slow etch rate in a wet etch solution for oxide during a subsequent wet dip out process of the remaining mould layer 25A. For instance, the sacrificial layer 29 may include an amorphous carbon layer.

The amorphous carbon layer may be formed using a plasma-based deposition method, such as a plasma enhanced chemical vapor deposition (PECVD) method or a plasma enhanced atomic layer deposition (PEALD) method. The amorphous carbon layer is not easily etched by wet etch solutions for oxide, such as a BOE or a HF solution. The amorphous carbon layer is easily removed by a dry ashing process in an oxidation ambience including O$_2$ or ozone (O$_3$). The amorphous carbon layer used as the sacrificial layer 29 is formed at a temperature ranging from approximately 200° C. to approximately 500° C. It is also important to control a thickness of the amorphous carbon layer.

The thickness of the sacrificial layer 29 is controlled such that the sacrificial layer 29 fills a space between neighboring storage nodes 28A in the A-A' line direction. The spacing distance between the storage nodes 28A is smaller than of the spacing distance in the B-B' line direction (refer to reference denotation 29A). The sacrificial layer 29 is formed such that the sacrificial layer 29 partially fills a space between neighboring storage nodes 28A in the B-B' line direction. The spacing distance between the storage nodes 28A in the B-B' line direction is larger than of the spacing distance between storage nodes 28A in the A-A' line direction (refer to reference denotation 29B). In other words, the sacrificial layer 29 is formed to have a substantially uniform thickness over upper surfaces of the substrate structure including the storage nodes 28A in the B-B' line direction. The sacrificial layer 29 is formed to have different thicknesses over different parts of the substrate structure because the storage nodes 28A are formed in a zigzag pattern. In other words, the different thicknesses of the sacrificial layer 29 results because the spacing distance between neighboring storage nodes 28A is small in the A-A' line direction, and the spacing distance between neighboring storage nodes 28A is large in the B-B' line direction. It is possible to control the thickness of the sacrificial layer 29 because the sacrificial layer 29 is formed using a plasma-based deposition method. Controlling the thickness of the sacrificial layer 29 refers to controlling a step coverage characteristic.

Figure 2F:
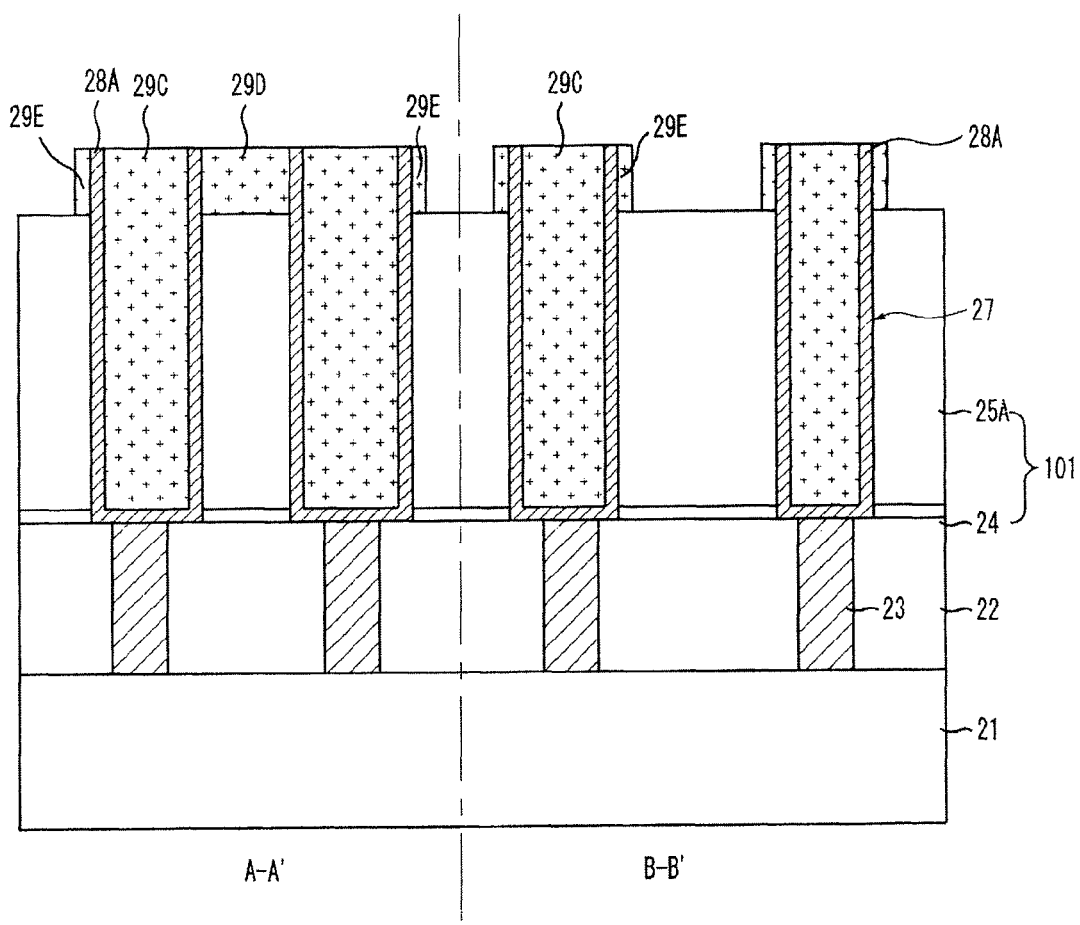

Referring to FIG. 2F, a dry etch-back process is performed on the sacrificial layer 29 to form first remaining sacrificial layers 29C, second remaining sacrificial layers 29D, and third remaining sacrificial layers 29E. The dry etch-back process includes performing a plasma etching using oxygen or ozone when the sacrificial layer 29 includes amorphous carbon.

The first remaining sacrificial layers 29C remain over the storage nodes 28A in both directions of the A-A' line and the B-B' line after the dry etch-back process of the sacrificial layer 29 is performed. The second remaining sacrificial layers 29D remain between neighboring storage nodes 28A in the A-A' line direction, covering a portion of the remaining mould layer 25A between neighboring storage nodes 28A. The third remaining sacrificial layers 29E remain between neighboring storage nodes 28A in the B-B' line direction such that the third remaining sacrificial layers 29E do not fill a space between neighboring storage nodes 28A. Since the thickness of portions of the sacrificial layer 29 in the B-B' line direction is relatively smaller than the thickness of portions of the sacrificial layer 29 in the A-A' line direction, portions of the remaining mould layer 25A between the storage nodes 28A in the B-B' line direction are exposed after the dry etch-back process is performed. Thus, the third remaining sacrificial layers 29E remain on the upper outer walls of the storage nodes 28A.

The dry etch-back process may be performed on the sacrificial layer 29 until top corners of the storage nodes 28A are exposed in both directions of the lines A-A' and B-B'. After performing the dry etch-back process on the sacrificial layer 29, the remaining mould layer 25A may not be exposed in the A-A' line direction because of the second remaining sacrificial layers 29D. The remaining mould layer 25A is exposed in the B-B' line direction by the third remaining sacrificial layers 29E.

Thus, the upper outer walls of the storage nodes 28A are enclosed by the third remaining sacrificial layers 29E in the B-B' line direction after the dry etch-back process. The upper outer walls of the storage nodes 28A in the A-A' line direction are supported by the second remaining sacrificial layer 29D formed between the storage nodes 28A. The third remaining sacrificial layers 29E remaining in a spacer formed in the B-B' line direction are formed as ring type sidewalls enclosing the upper outer walls of the storage nodes 28A. The third remaining sacrificial layers 29E also remain on an upper outer wall of each storage node 28A in the A-A' line direction.

Figure 2G:
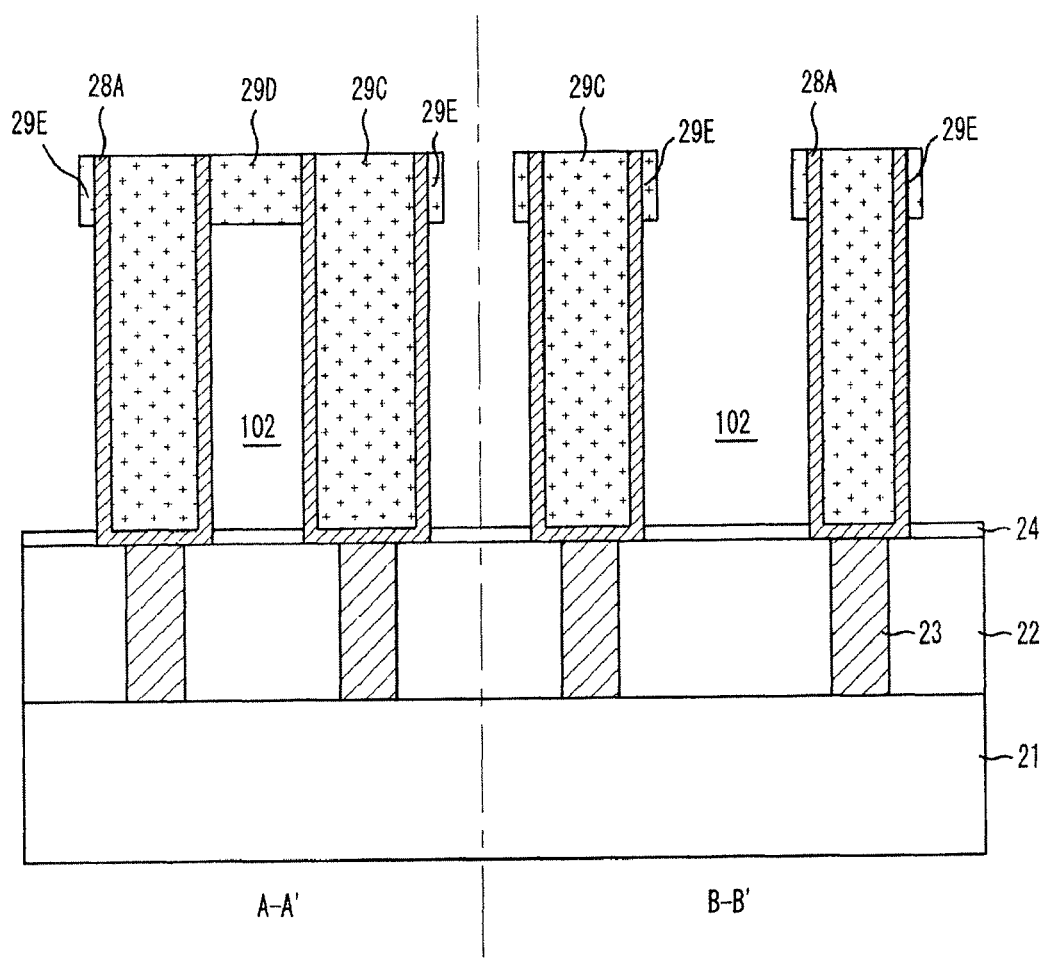

Referring to FIG. 2G, a wet etch process for oxide and a dry process are performed. For instance, the wet etch process may include performing a wet dip out process. During the wet dip out process, the remaining mould layer 25A including oxide is removed in both directions of the A-A' line and the B-B' line. The cylinder type storage nodes 28A supported by the ring type third remaining sacrificial layers 29E do not lean during the wet dip out process and the dry process.

Figure 2H:
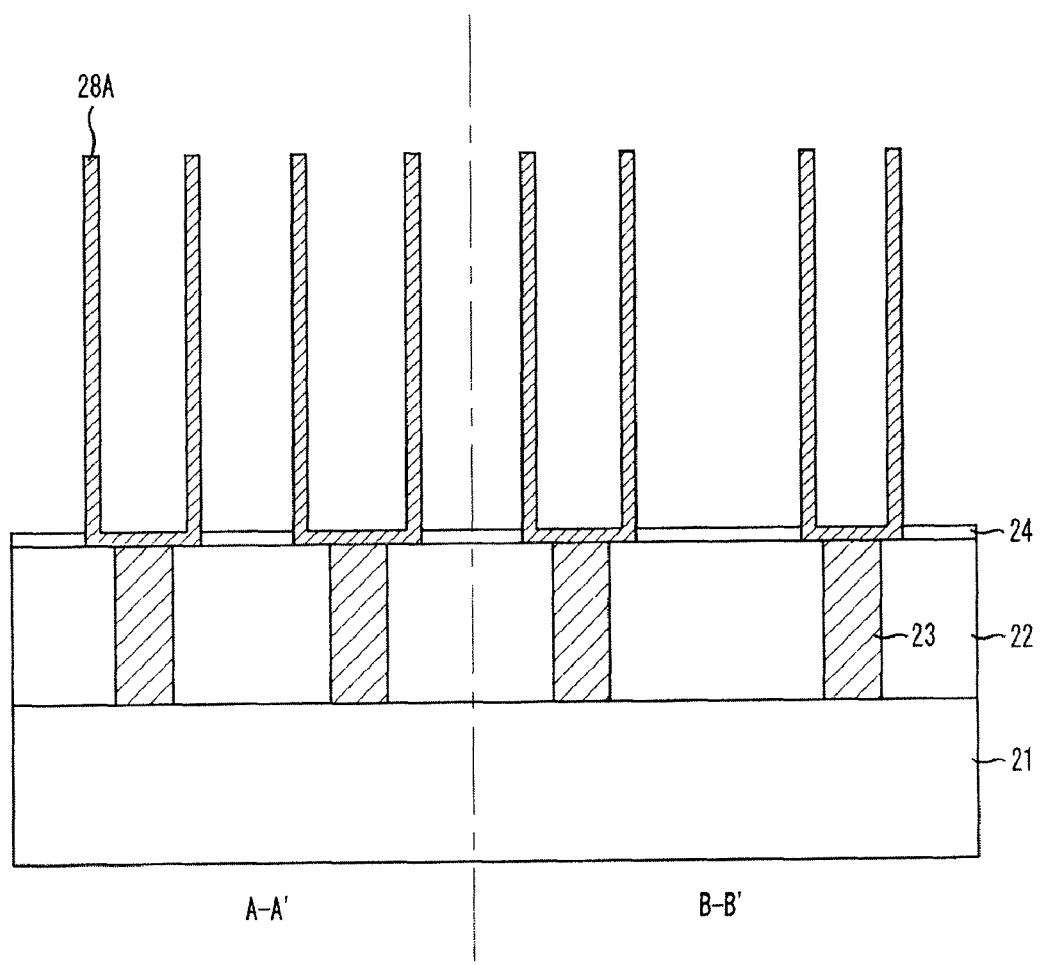

Referring to FIG. 2H, the first, second, and third remaining sacrificial layers 29C, 29D, and 29E are removed. The first, second, and third remaining sacrificial layers 29C, 29D, and 29E are removed by employing a dry ashing process because the first, second, and third remaining sacrificial layers 29C, 29D, and 29E include amorphous carbon. Amorphous carbon layers may be removed by dry ashing using oxygen or ozone. The storage nodes 28A are not damaged during the dry ashing process because the dry ashing process is performed at a low ashing temperature using oxygen.

Although not illustrated, subsequent dielectric layer and upper electrode formation processes are performed to form a cylinder type capacitor. The dielectric layer may include tantalum oxide ($Ta_2O_5$), aluminum oxide ($Al_2O_3$), titanium oxide ($TiO_2$), hafnium oxide ($HfO_2$), zirconium dioxide ($ZrO_2$), strontium titanate (STO), barium strontium titanate (BST), or a combination thereof. The upper electrode may include a TiN layer formed using a CVD method, a TiN layer formed using an ALD method, a Ru layer formed using a CVD method, a Ru layer formed using an ALD method, a Pt layer formed using an ALD method, an Ir layer formed using an ALD method, or a combination thereof.

Figure 3A:
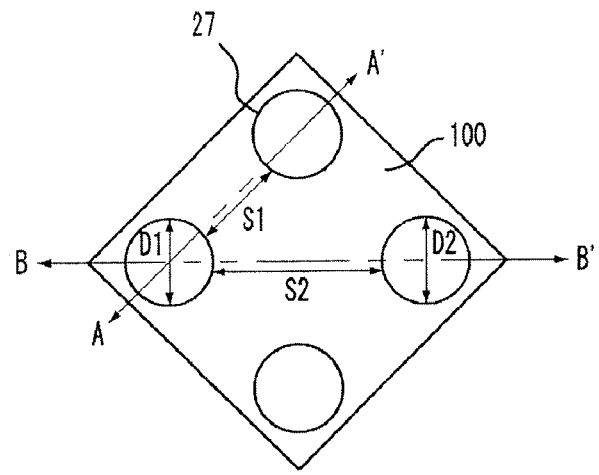
FIG. 3A illustrates a plan view of a photoresist pattern according to the first embodiment of the present invention.
Figure 3B:
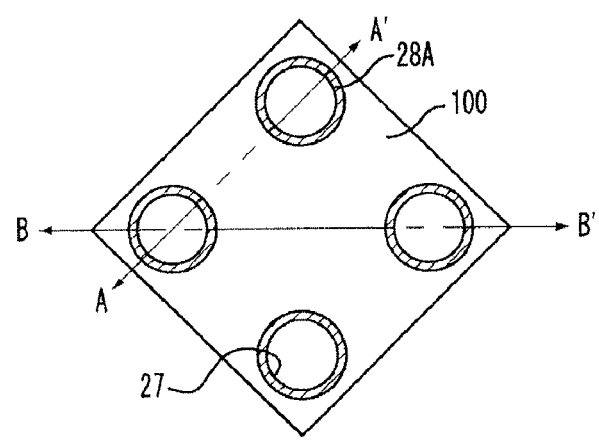
FIG. 3B illustrates a plan view of open regions according to the first embodiment of the present invention.
Figure 3C:
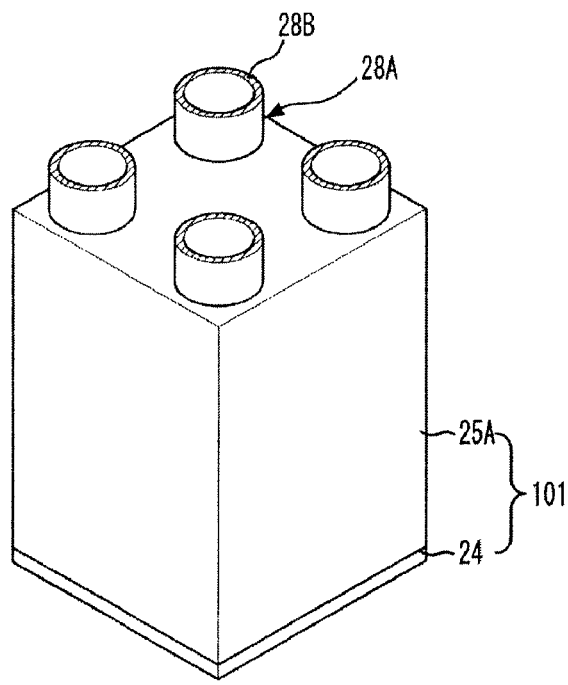
FIG. 3C illustrates a perspective view showing a result after a partial etching is performed on a mould layer according to the first embodiment of the present invention.
Figure 3D:
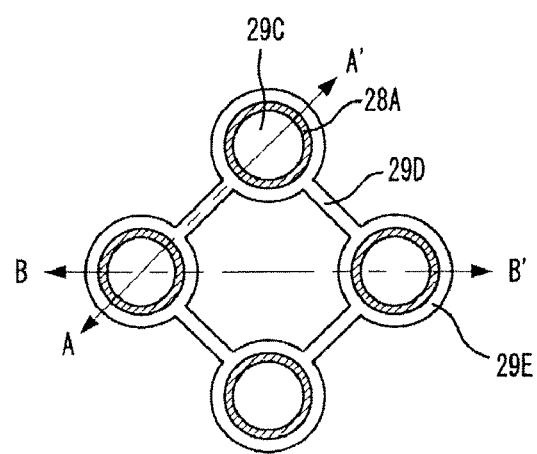
FIG. 3D illustrates a plan view showing a result after performing a dry etch-back process on a sacrificial layer according to the first embodiment of the present invention.
Figure 3E:
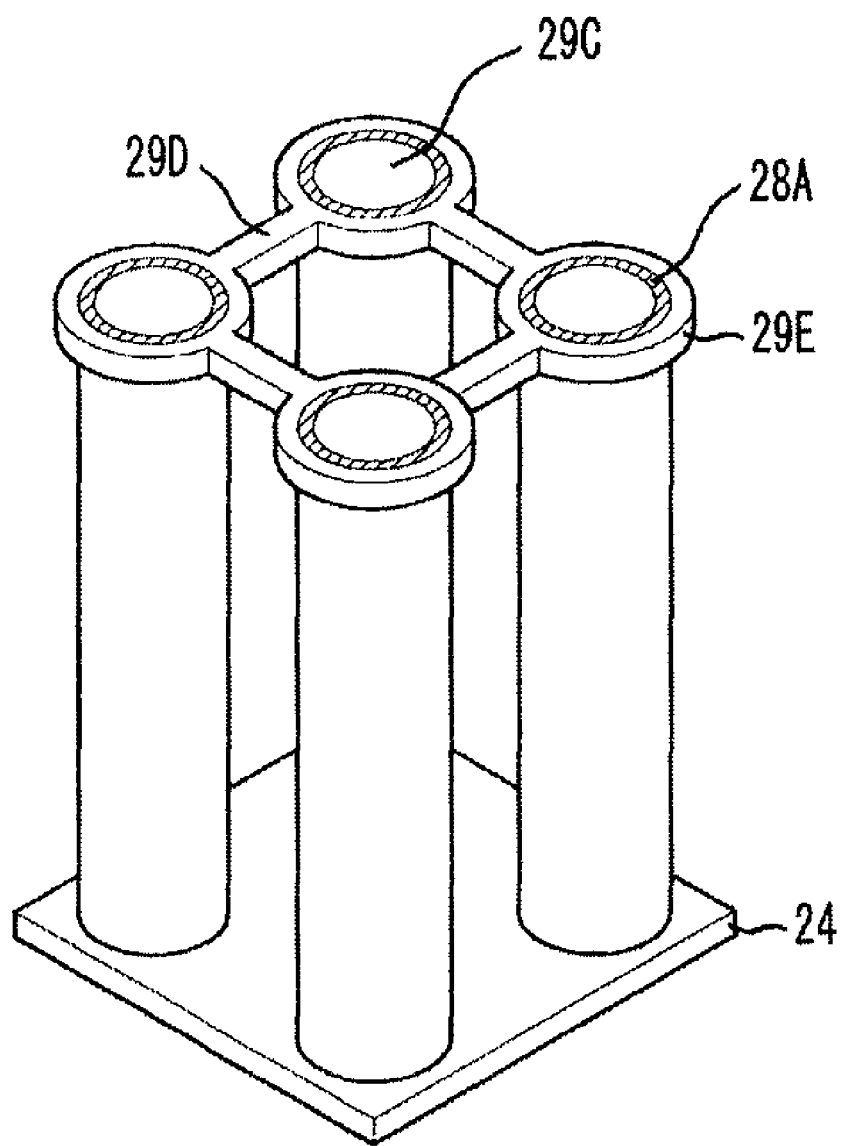
FIG. 3E illustrates a perspective view showing a result after performing a wet dip out process for oxide according to the first embodiment of the present invention.

FIG. 3A illustrates a plan view of a photoresist pattern according to the first embodiment of the present invention. FIG. 3B illustrates a plan view of open regions according to the first embodiment. FIG. 3C illustrates a plan view showing a result after a partial etching is performed on a mould layer according to the first embodiment. FIG. 3D illustrates a plan view showing a result after performing a dry etch-back process on a sacrificial layer according to the first embodiment. FIG. 3E illustrates a perspective view showing a result after performing a wet dip out process for oxide according to the first embodiment.

FIG. 3A illustrates a plan view of the open regions 27 according to the first embodiment. Diameters D1 and D2 of the open regions 27 arranged in a zigzag pattern are substantially the same in directions of the A-A' line and the B-B' line, i.e., D1=D2 (also refer to FIG. 2A). A second spacing distance S2 between the open regions 27 along the B-B' line direction is larger than a first spacing distance S1 between the open regions 27 along the A-A' line direction (also refer to FIG. 2A).

FIG. 3B illustrates a plan view of the resultant substrate structure after the storage node isolation process is performed. The storage nodes 28A are formed on the surface of the open regions 27 of the isolation layer 100. The storage nodes 28A are formed in a zigzag pattern.

FIG. 3C illustrates a perspective view of the result after the patterned mould layer 25 is partially etched. The remaining isolation layer 101, including the stack structure of the patterned etch stop layer 24 and the remaining mould layer 25A, remains between adjacent storage nodes 28A. The upper outer walls 28B of the storage nodes 28A are exposed because portions of the patterned mould layer 25 are etched.

FIG. 3D illustrates a plan view of the resultant substrate structure after the dry etch-back process is performed on the sacrificial layer 29 according to the first embodiment. The second remaining sacrificial layers 29D remain in a coupling structure in the A-A' line direction and the third remaining sacrificial layers 29E remain in a discontinuing structure in the B-B' line direction because the dry etch-back process performed on the sacrificial layer 29 includes performing a blanket etch-back process. The third remaining sacrificial layers 29E enclosing the upper outer walls of the storage nodes 28A are coupled to each other by the second remaining sacrificial layers 29D in the A-A' line direction. However, the third remaining sacrificial layers 29E are not coupled to each other in the B-B' line direction. The first remaining sacrificial layers 29C remain over the storage nodes 28A.

Each upper outer wall of the storage nodes 28A is enclosed by the third remaining sacrificial layer 29E. The ring type third remaining sacrificial layers 29E are coupled by the second remaining sacrificial layers 29D, thereby supporting the storage nodes 28A. Thus, the second and third remaining sacrificial layers 29D and 29E may be referred to as a connected ring structure fixed around the upper outer walls of the storage nodes 28A.

FIG. 3E illustrates a perspective view showing the result after performing the wet dip out process for oxide according to the first embodiment. The storage nodes 28A do not lean during the wet dip out process and the dry process because the storage nodes 28A are supported by the second and third remaining sacrificial layers 29D and 29E of the connected ring structure. The wet dip out process may use a BOE or a HF solution as an oxide etchant. The wet dip out process is performed for a period of time sufficient to remove the remaining mould layer 25A. The dry process is then performed. The oxide etchant does not penetrate into the storage nodes 28A during the wet dip out process because the first remaining sacrificial layers 29C remain over the storage nodes 28A.

According to the first embodiment, the ring type structures are formed around the upper outer walls of each storage node and are coupled to each other to form the connected ring structure. The connected ring structure reduces the likelihood that the storage nodes will lean during the wet dip out process for oxide and the dry process, thereby decreasing the likelihood of bridge generation between neighboring storage nodes. In other words, the connected ring structure decreases the likelihood of bridge generation during the wet dip out process and the dry process which are generally used in forming the cylinder type storage nodes. Thus, a height of the storage nodes may be maximized to maintain a sufficient level of capacitance.

FIGS. 4A to 4H illustrate cross-sectional views of a method for fabricating a cylinder type capacitor according to a second embodiment of the present invention.

Figure 4A:
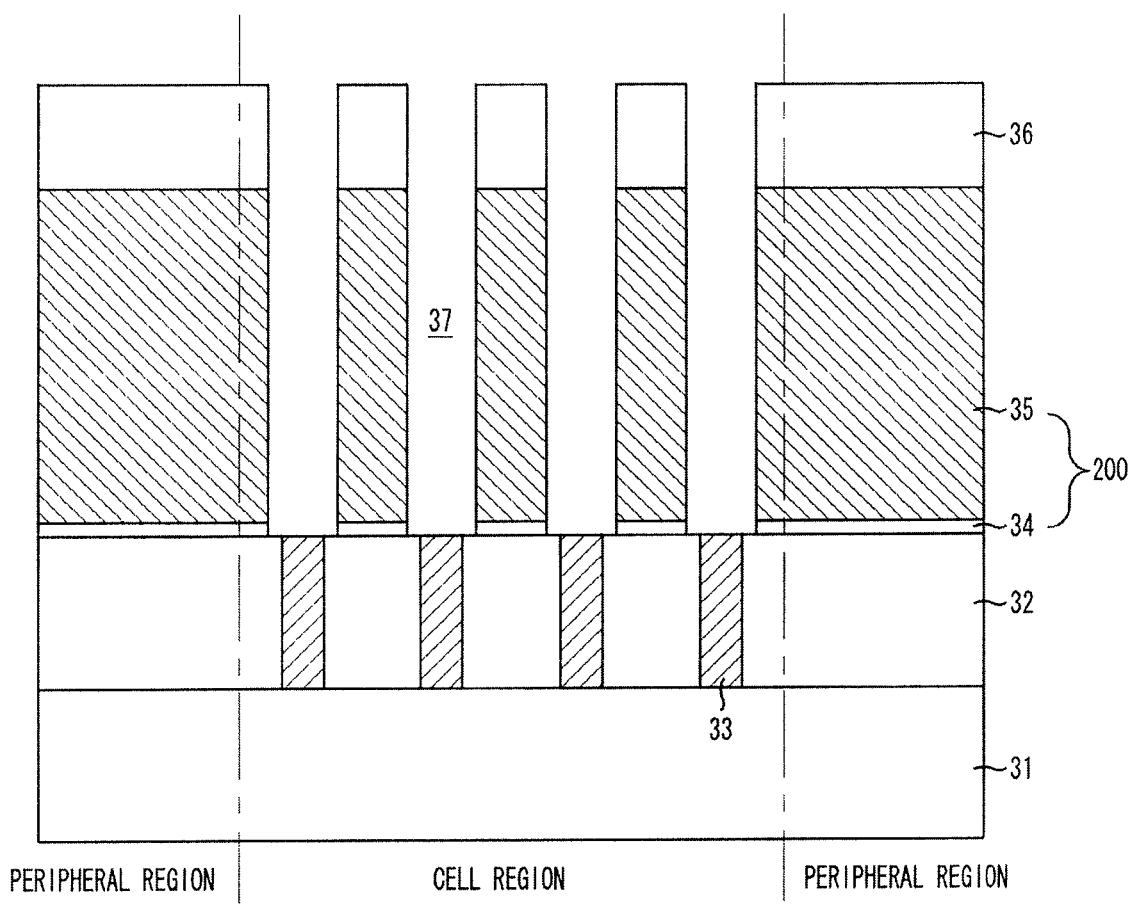
FIGS. 4A to 4H illustrate cross-sectional views of a method for fabricating a cylinder type capacitor according to a second embodiment of the present invention.

Referring to FIG. 4A, an insulation layer 32 is formed over a semi-finished substrate 31. The substrate 31 is divided into a cell region and peripheral regions. Storage node contact holes are formed in the insulation layer 32, and storage node contact plugs 33 are formed in the storage node contact holes. Although not illustrated, processes for forming transistors, word lines, and bit lines are generally performed before forming the insulation layer 32. The insulation layer 32 may include an undoped silicate glass (USG) layer and may be formed to have a thickness ranging from approximately 1,000 Å to approximately 3,000 Å. A patterned etch stop layer 34 is formed over the insulation layer 32. A patterned mould layer 35 is formed over the patterned etch stop layer 34.

The insulation layer 32 is etched using a storage node contact mask to form the storage node contact holes. A polysilicon layer fills the storage node contact holes and an etch-back process is performed to form the storage node contact plugs 33. Although not illustrated, barrier metals may be formed over the storage node contact plugs 33. The barrier metals may include titanium (Ti) or titanium nitride (TiN). An etch stop layer is formed over the insulation layer 32 and the storage node contact plugs 33. The etch stop layer may include a nitride-based material. For instance, the etch stop layer may include a silicon nitride ($Si_3N_4$) layer.

A mould layer is formed over the etch stop layer. The mould layer may include an insulation layer. For instance, an oxide-based layer such as a phosphosilicate glass (PSG) layer or a plasma enhanced tetraethyl orthosilicate (PETEOS) layer may be formed to a certain thickness sufficient to maintain a necessary surface area for a desired dielectric capacitance. The mould layer may be formed in a double-layer structure including oxide-based layers. The double-layer structure may be formed such that an upper oxide-based layer has a smaller etch rate in a wet etch solution for oxide than a bottom oxide-based layer. For example, PSG may be formed and PETEOS may then be formed over the PSG in the double-layer structure.

A first photoresist layer is formed over the mould layer. A photo-exposure and developing process is performed on the first photoresist layer to form a first photoresist pattern 36. It is important for the first photoresist pattern 36 to form openings in a zigzag pattern. The openings are formed in the first photoresist pattern 36 where subsequent storage nodes are to be formed. The mould layer is etched using the first photoresist pattern 36 as an etch barrier to form the patterned mould layer 35 and to form a plurality of open regions 37. The etch stop layer exposed by the open regions 37 is etched to form the patterned etch stop layer 34 and to expose upper surfaces of the storage node contact plugs 33.

The open regions 37 are formed to have a trench shape. The open regions 37 are also referred to as storage node holes because the subsequent storage nodes are formed on the surface of the open regions 37. The open regions 37 are formed in a zigzag pattern, mirroring the zigzag arrangement of the first photoresist pattern 36. The open regions 37 are formed in the zigzag pattern in substantially the same manner as the open regions 27 of the first embodiment shown in FIG. 3A. The open regions 37 are formed only in the cell region. A stack structure, including the patterned etch stop layer 34 and the patterned mould layer 35 providing the open regions 37, is referred to as an isolation layer 200.

Figure 4B:
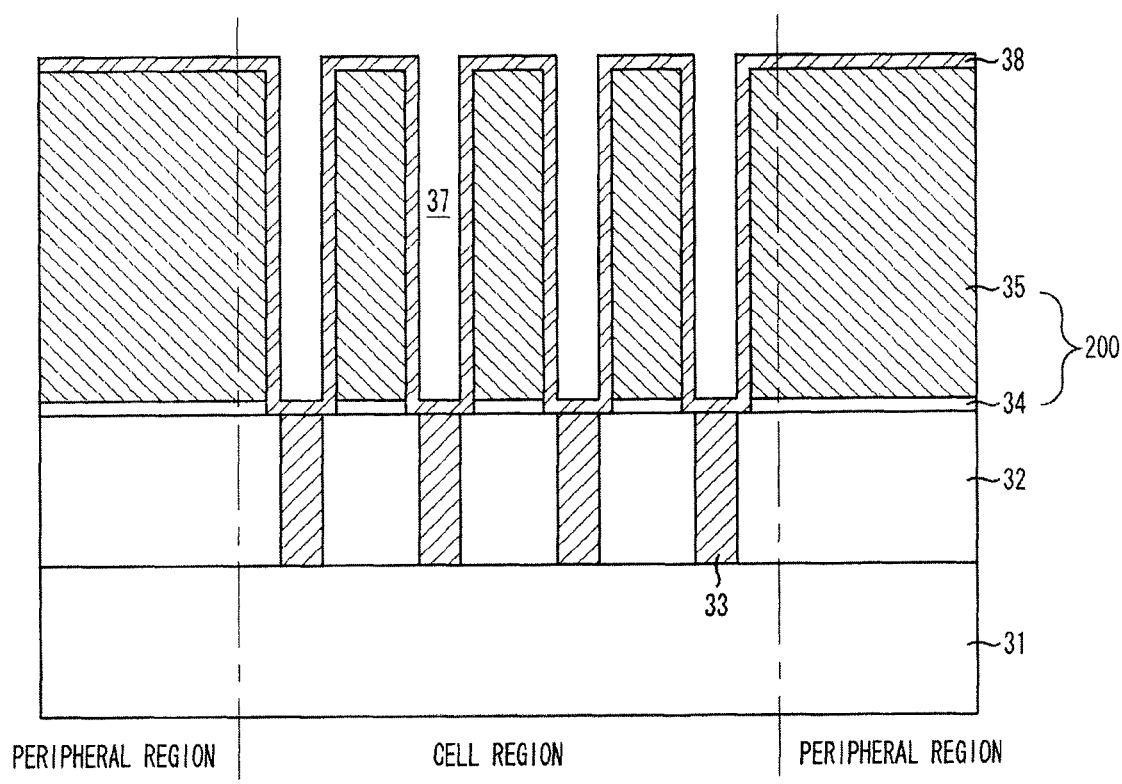

Referring to FIG. 4B, the first photoresist pattern 36 is removed. A conductive layer 38 for forming the storage nodes is formed over the isolation layer 200 and the open regions 37. The conductive layer 38 may include a metal electrode such as TiN or ruthenium (Ru). The conductive layer 38 may also include other materials besides TiN and Ru. The conductive layer 38 may be formed to have a thickness ranging from approximately 200 Å to approximately 400 Å using a chemical vapor deposition (CVD) method or an atomic layer deposition (ALD) method.

When forming the conductive layer 38 including TiN using the CVD method, a CVD TiN deposition method is performed using titanium tetrachloride ($TiCl_4$) as a source and using ammonia ($NH_3$) as a reaction gas at a temperature ranging from approximately 400° C. to approximately 700° C. When forming the conductive layer 38 including Ru, the ALD method or the CVD method is performed using Ru(EtCp)$_2$ as a source and using oxygen ($O_2$) gas as a reaction gas at a temperature ranging from approximately 200° C. to approximately 400° C. The conductive layer 38 for forming the storage nodes may include platinum (Pt) formed by the ALD method or iridium (Ir) formed by the ALD method.

Figure 4C:
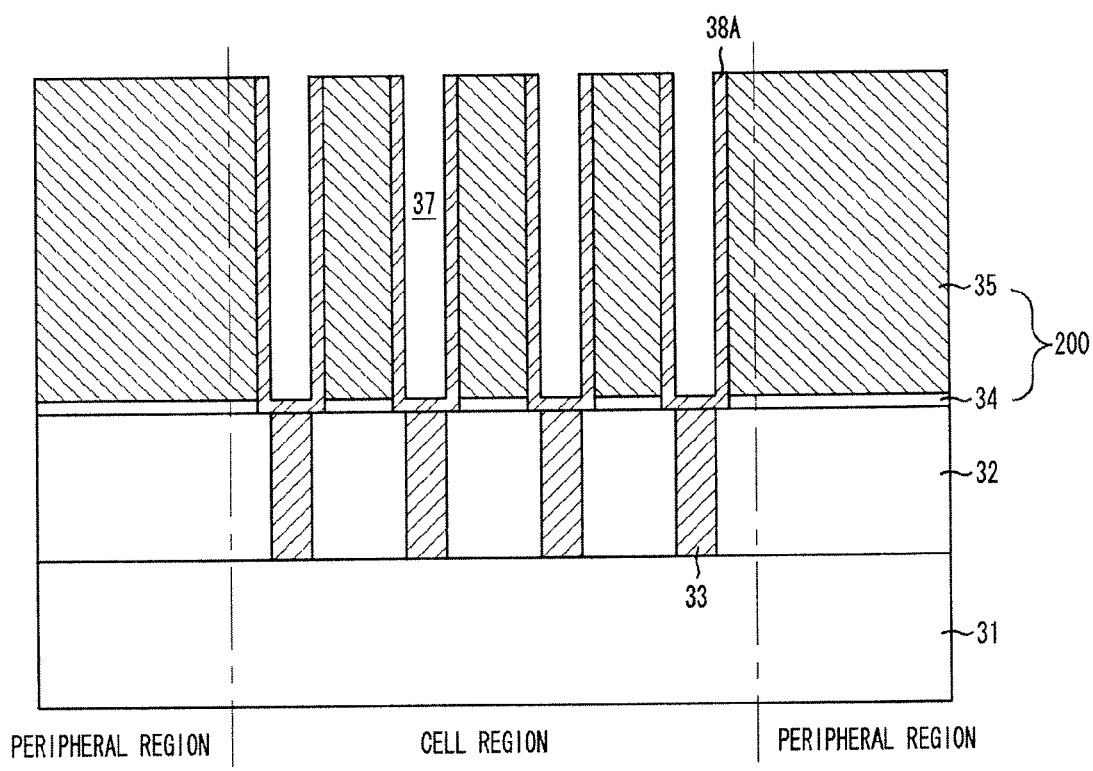

Referring to FIG. 4C, a storage node isolation process is performed. The storage node isolation process includes performing a dry etch-back process on the conductive layer 38. The storage node isolation process may include performing a CMP process or a dry etch-back process using a photoresist layer barrier or an oxide-based layer barrier when the conductive layer 38 includes TiN. Using the photoresist layer barrier or the oxide-based layer barrier may reduce contamination in the open regions 37 during the storage node isolation process.

The storage node isolation process is performed until top surfaces of the patterned mould layer 35 are exposed. Thus, cylinder type storage nodes 38A are formed on the surface of the open regions 37, isolated from each other. In other words, the CMP process or the dry etch-back process is performed to remove portions of the conductive layer 38 formed outside the open regions 37, thereby forming the cylinder type storage nodes 38A over bottom surfaces and sidewalls of the open regions 37. After the storage node isolation process is performed, the storage nodes 38A are formed on the surface of the open regions 37 of the isolation layer 200. The storage nodes 38A are disposed in a zigzag pattern in substantially the same manner as the storage nodes 28A of the first embodiment shown in FIG. 3B.

Figure 4D:
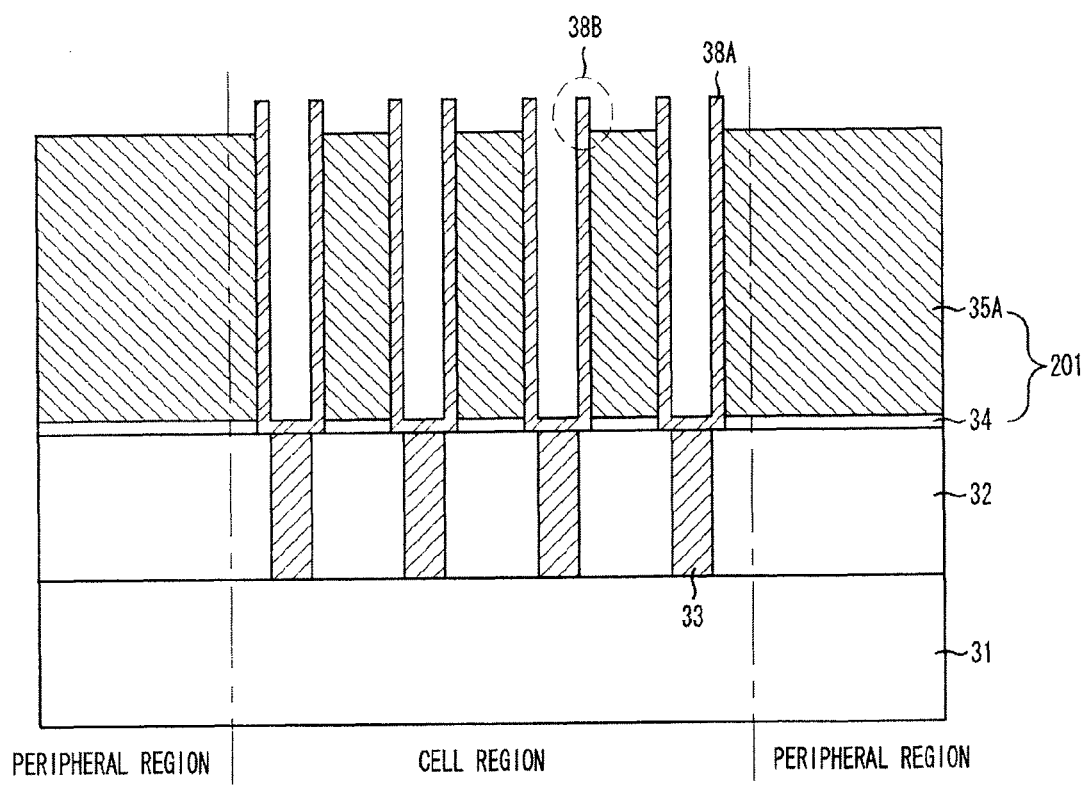

Referring to FIG. 4D, the patterned mould layer 35 is partially etched to form a remaining mould layer 35A. Thus, upper outer walls 38B of the storage nodes 38A are exposed. A remaining isolation layer 201 includes the remaining mould layer 35A and the patterned etch stop layer 34.

The patterned mould layer 35 is selectively etched using an oxide etchant because the patterned mould layer 35 includes an oxide-based material. For instance, a wet etch may be used. The wet etch may include performing a wet dip out process. The wet etch of the patterned mould layer 35 may include etching the patterned mould layer 35 to a thickness ranging from approximately 200 nm to approximately 1,000 nm using a buffered oxide etchant (BOE) or a hydrogen fluoride (HF) solution. For instance, approximately 700 nm to approximately 800 nm of the patterned mould layer 35 may be etched.

After the patterned mould layer 35 is partially etched, the remaining isolation layer 201, including the stack structure of the patterned etch stop layer 34 and the remaining mould layer 35A, remains between adjacent storage nodes 38A. The upper outer walls 38B of the storage nodes 38A are exposed because portions of the patterned mould layer 35 are etched.

Figure 4E:
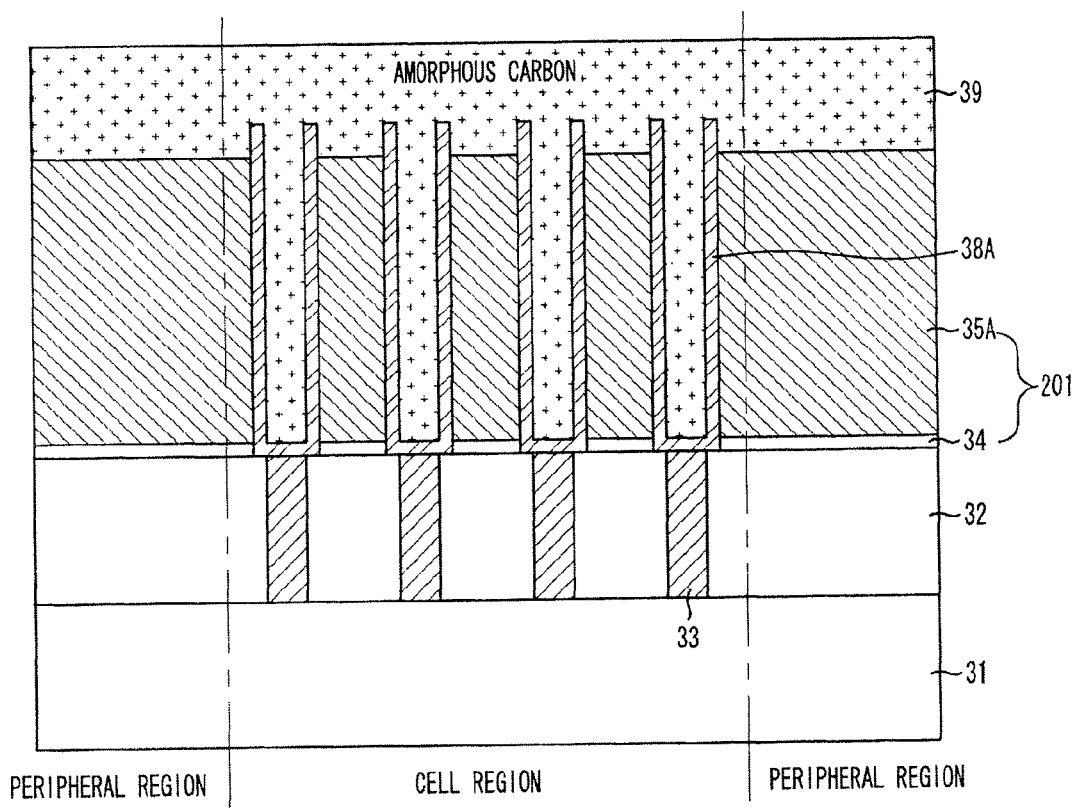

Referring to FIG. 4E, a sacrificial layer 39 is formed over the storage nodes 38A and the remaining isolation layer 201. The sacrificial layer 39 may include a material which may not be etched or which has a substantially slow etch rate in a wet etch solution for oxide during a subsequent wet dip out process of the remaining mould layer 35A. For instance, the sacrificial layer 39 may include an amorphous carbon layer.

The amorphous carbon layer may be formed using a plasma-based deposition method, such as a plasma enhanced chemical vapor deposition (PECVD) method or a plasma enhanced atomic layer deposition (PEALD) method. The amorphous carbon layer is not easily etched by wet etch solutions for oxide, such as a BOE or a HF solution. The amorphous carbon layer is easily removed by a dry ashing process in an oxidation ambience including $O_2$ or ozone ($O_3$).

The amorphous carbon layer used as the sacrificial layer 39 is formed at a temperature ranging from approximately 200° C. to approximately 500° C.

The sacrificial layer 39 is formed to have a certain thickness sufficient to fill a space between neighboring storage nodes 38A. The sacrificial layer 39 may be formed to cover the substrate structure without controlling the thickness of the sacrificial layer 39 because a dry etch-back process of the sacrificial layer 39 is omitted in the second embodiment, unlike the first embodiment.

Figure 4F:
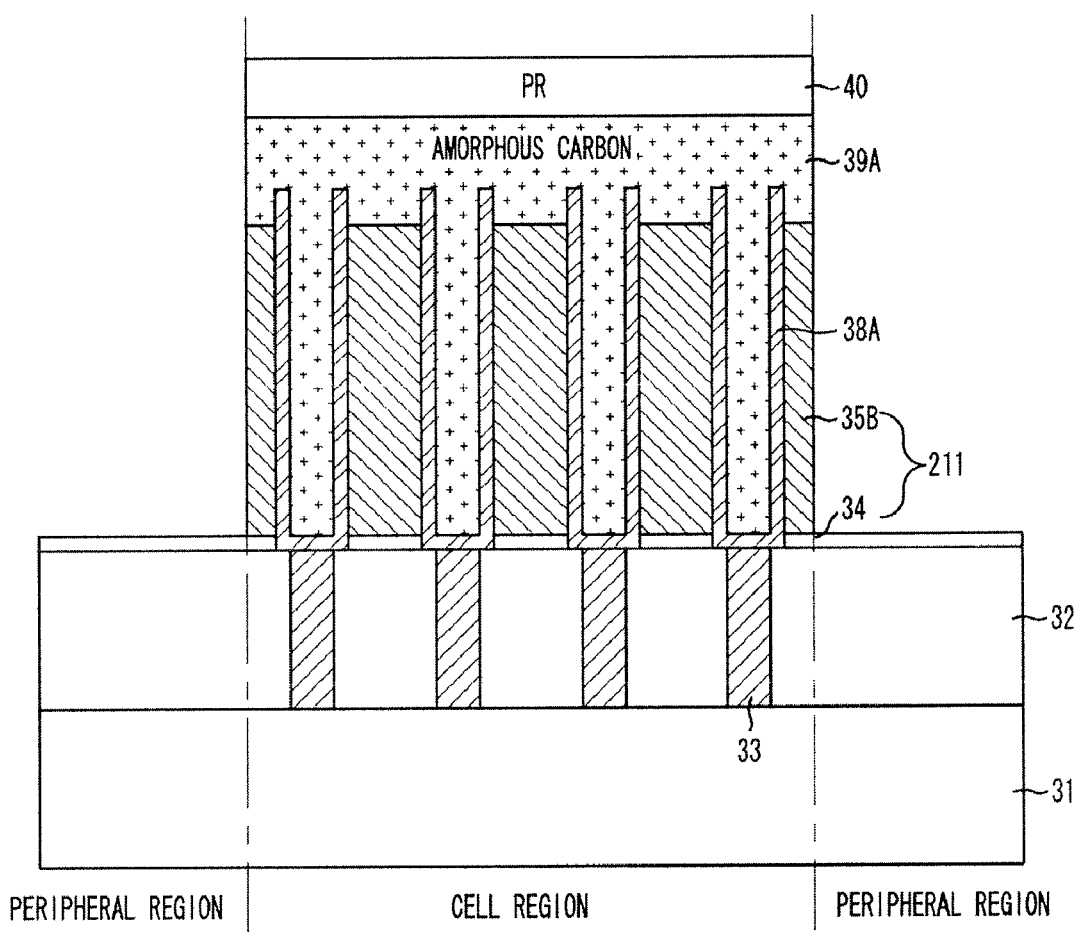

Referring to FIG. 4F, a second photoresist layer is formed over the sacrificial layer 39. A photo-exposure and developing process is performed on the second photoresist layer to form a second photoresist pattern 40. The second photoresist pattern 40 covers the cell region but exposes the peripheral regions of the substrate structure.

The sacrificial layer 39 is etched using the second photoresist pattern 40 as an etch barrier. Thus, a sacrificial pattern 39A is formed. The sacrificial pattern 39A remains only in the cell region because portions of the sacrificial layer 39 in the peripheral regions are etched. The remaining mould layer 35A is etched after the sacrificial pattern 39A is formed, thereby forming a mould pattern 35B. The etching of the remaining mould layer 35A may include performing a dry etch process. Portions of the remaining mould layer 35A in the peripheral regions are etched. Thus, the mould pattern 35B defines spaces around the cell region into which a wet etch solution may flow. The mould pattern 35B may be formed such that the mould pattern 35B remains only in the cell region after the portions of the remaining mould layer 35A are etched in the peripheral regions. Alternatively, the mould pattern 35B may be formed such that portions of the remaining mould layer 35A remain over the patterned etch stop layer 34 at a certain thickness in the peripheral regions. An isolation pattern 211 includes the mould pattern 35B and the patterned etch stop layer 34.

Figure 4G:
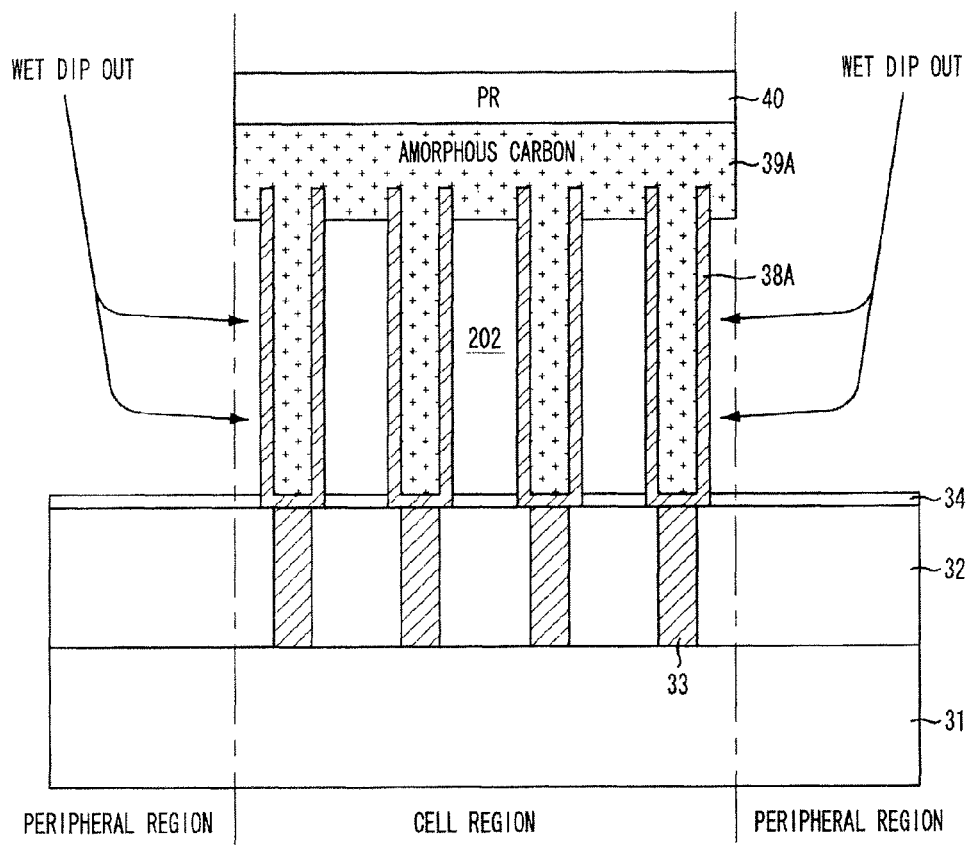

Referring to FIG. 4G, a wet etch process for oxide is performed. For instance, the wet etch process may include performing a wet dip out process. The mould pattern 35B including an oxide-based material is removed during the wet dip out process. A wet etch solution flows sideways into the spaces defined around the cell region and removes the mould pattern 35B. Thus, empty spaces 202 are formed between the storage nodes 38A. The sacrificial pattern 39A is not easily etched during a wet dip out process for oxide. Thus, the sacrificial pattern 39A decreases the likelihood of leaning storage nodes 38A. The wet dip out process may use a BOE or a HF solution as an oxide etchant. The wet dip out process is performed for a period of time sufficient to remove the mould pattern 35B. Neighboring storage nodes 38A are supported by the sacrificial pattern 39A during the wet dip out process, and thus, the likelihood of leaning storage nodes 38A is reduced during a dry process which is performed after the wet dip out process.

Figure 4H:
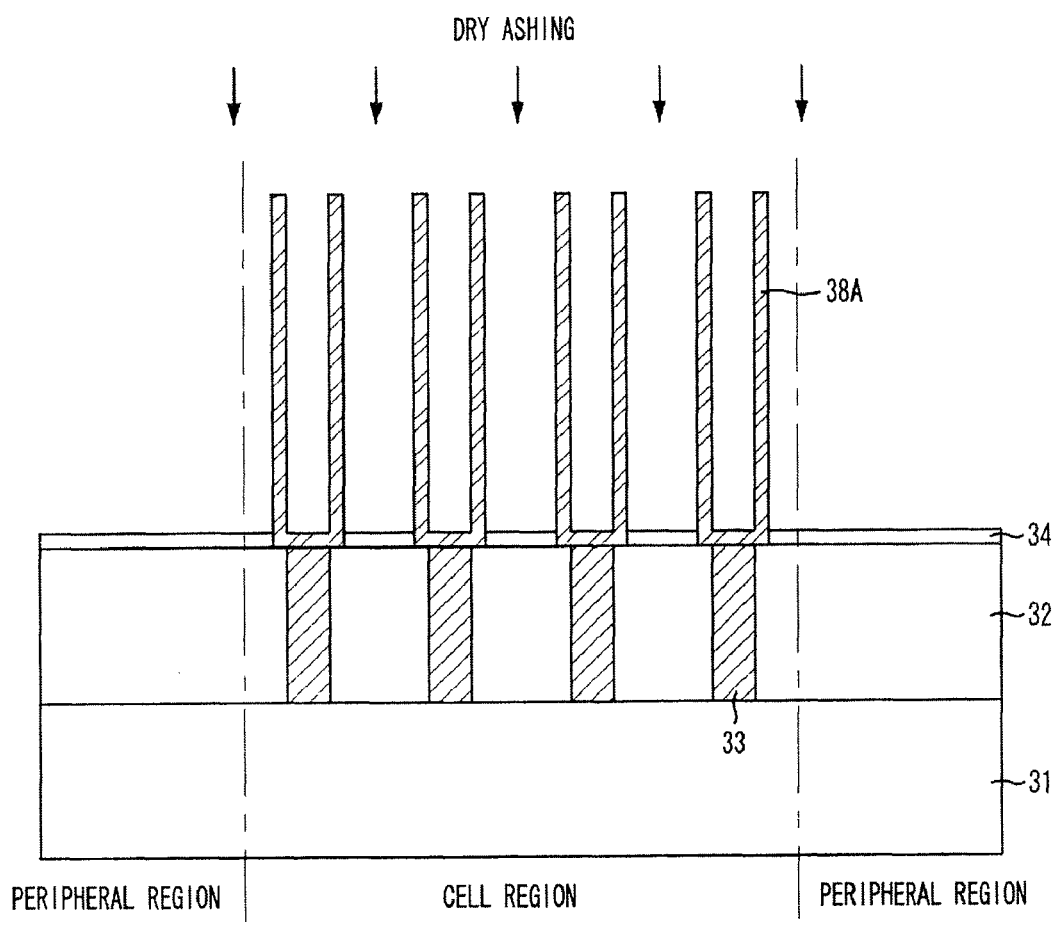

Referring to FIG. 4H, a photoresist ashing process is performed. The photoresist ashing process includes a dry ashing process. The second photoresist pattern 40 and the sacrificial pattern 39A are simultaneously removed using the dry ashing process. The sacrificial pattern 39A including amorphous carbon may be removed at substantially the same time as the second photoresist pattern 40 because amorphous carbon can be removed by a dry ashing using oxygen or ozone. The storage nodes 38A are not damaged because the dry ashing process is performed at a low temperature using oxygen.

Although not illustrated, subsequent dielectric layer and upper electrode formation processes are performed to form a cylinder type capacitor. The dielectric layer may include tantalum oxide ($Ta_2O_5$), aluminum oxide ($Al_2O_3$), titanium oxide ($TiO_2$), hafnium oxide ($HfO_2$), zirconium dioxide ($ZrO_2$), strontium titanate (STO), barium strontium titanate (BST), or a combination thereof. The upper electrode may include a TiN layer formed using a CVD method, a TiN layer formed using an ALD method, a Ru layer formed using a CVD method, a Ru layer formed using an ALD method, a Pt layer formed using an ALD method, an Ir layer formed using an ALD method, or a combination thereof.

FIGS. 5A to 5H illustrate cross-sectional views of a method for fabricating a cylinder type capacitor according to a third embodiment of the present invention.

Figure 5A:
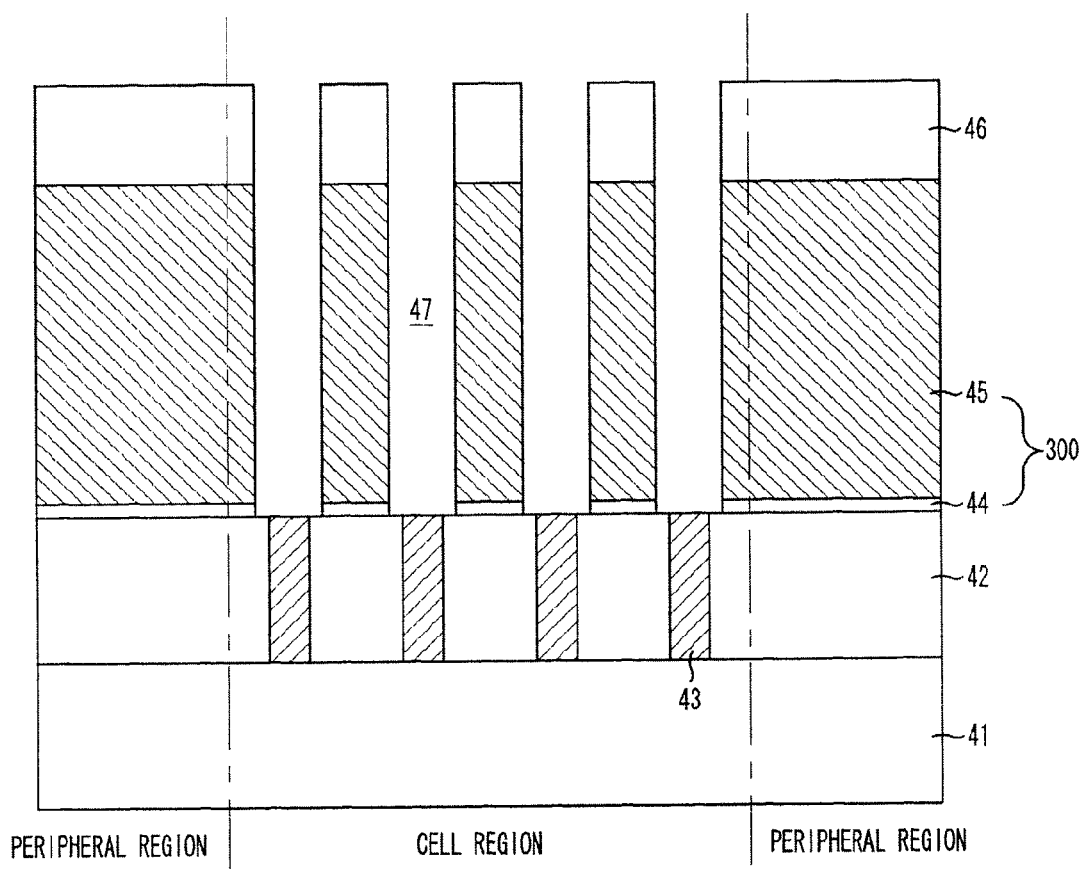
FIGS. 5A to 5H illustrate cross-sectional views of a method for fabricating a cylinder type capacitor according to a third embodiment of the present invention.

Referring to FIG. 5A, an insulation layer 42 is formed over a semi-finished substrate 41. The substrate 41 is divided into a cell region and peripheral regions. Storage node contact holes are formed in the insulation layer 42, and storage node contact plugs 43 are formed in the storage node contact holes. Although not illustrated, processes for forming transistors, word lines, and bit lines are generally performed before forming the insulation layer 42. The insulation layer 42 may include an undoped silicate glass (USG) layer and may be formed to have a thickness ranging from approximately 1,000 Å to approximately 3,000 Å. A patterned etch stop layer 44 is formed over the insulation layer 42. A patterned mould layer 45 is formed over the patterned etch stop layer 44.

The insulation layer 42 is etched using a storage node contact mask to form the storage node contact holes. A polysilicon layer fills the storage node contact holes and an etch-back process is performed to form the storage node contact plugs 43. Although not illustrated, barrier metals may be formed over the storage node contact plugs 43. The barrier metals may include titanium (Ti) or titanium nitride (TiN). An etch stop layer is formed over the insulation layer 42 and the storage node contact plugs 43. The etch stop layer may include a nitride-based material. For instance, the etch stop layer may include a silicon nitride ($Si_3N_4$) layer.

A mould layer is formed over the etch stop layer. The mould layer may include an insulation layer. For instance, an oxide-based layer such as a phosphosilicate glass (PSG) layer or a plasma enhanced tetraethyl orthosilicate (PETEOS) layer may be formed to a certain thickness sufficient to maintain a necessary surface area for a desired dielectric capacitance. The mould layer may be formed in a double-layer structure including oxide-based layers. The double-layer structure may be formed such that an upper oxide-based layer has a smaller etch rate in a wet etch solution for oxide than a bottom oxide-based layer. For example, PSG may be formed and PETEOS may be then formed over the PSG in the double-layer structure.

A photoresist layer is formed over the mould layer. A photo-exposure and developing process is performed on the photoresist layer to form a photoresist pattern 46. It is important for the photoresist pattern 46 to form openings in a zigzag pattern. The openings are formed in the photoresist pattern 46 where subsequent storage nodes are to be formed. The mould layer is etched using the photoresist pattern 46 as an etch barrier to form the patterned mould layer 45 and to form a plurality of open regions 47. The etch stop layer exposed by the open regions 47 is etched to form the patterned etch stop layer 44 and to expose upper surfaces of the storage node contact plugs 43.

The open regions 47 are formed to have a trench shape. The open regions 47 are also referred to as storage node holes because the subsequent storage nodes are formed on the surface of the open regions 47. The open regions 47 are formed in a zigzag pattern, mirroring the zigzag arrangement of the photoresist pattern 46. The open regions 47 are formed in the zigzag pattern in substantially the same manner as the open regions 27 of the first embodiment shown in FIG. 3A. A stack structure, including the patterned etch stop layer 44 and the patterned mould layer 45 providing the open regions 47, is referred to as an isolation layer 300.

Figure 5B:
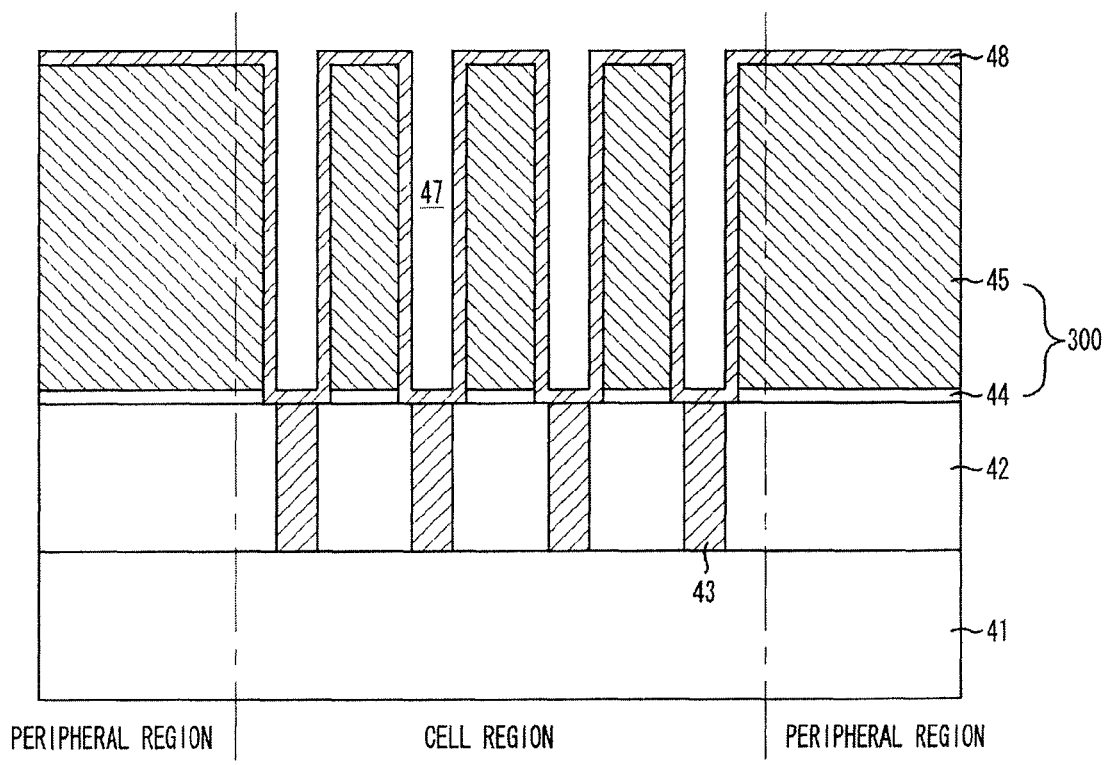

Referring to FIG. 5B, the photoresist pattern 46 is removed. A conductive layer 48 for forming the storage nodes is formed over the isolation layer 300 and the open regions 47. The conductive layer 48 may include a metal electrode such as TiN or ruthenium (Ru). The conductive layer 48 may also include other materials besides TiN and Ru. The conductive layer 48 may be formed to have a thickness ranging from approximately 200 Å to approximately 400 Å using a chemical vapor deposition (CVD) method or an atomic layer deposition (ALD) method.

When forming the conductive layer 48 including TiN using the CVD method, a CVD TiN deposition method is performed using titanium tetrachloride ($TiCl_4$) as a source and using ammonia ($NH_3$) as a reaction gas at a temperature ranging from approximately 400° C. to approximately 700° C. When forming the conductive layer 48 including Ru, the ALD method or the CVD method is performed using $Ru(EtCp)_2$ as a source and using oxygen ($O_2$) gas as a reaction gas at a temperature ranging from approximately 200° C. to approximately 400° C. The conductive layer 48 for use as the storage nodes may include platinum (Pt) formed by the ALD method or iridium (Ir) formed by the ALD method.

Figure 5C:
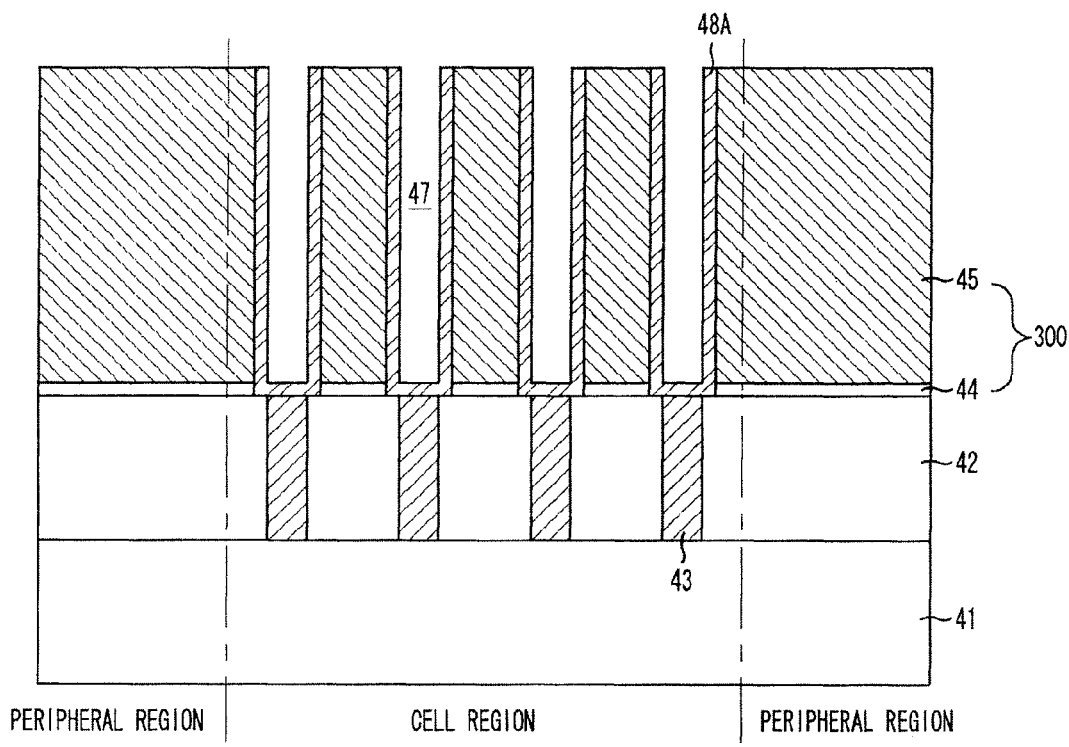

Referring to FIG. 5C, a storage node isolation process is performed. The storage node isolation process includes performing a dry etch-back process on the conductive layer 48. The storage node isolation process may include performing a CMP process or a dry etch-back process using a photoresist layer barrier or an oxide-based layer barrier when the conductive layer 48 includes TiN. Using the photoresist layer barrier or the oxide-based layer barrier may reduce contamination in the open regions 47 during the storage node isolation process.

The storage node isolation process is performed until top surfaces of the patterned mould layer 45 are exposed. Thus, cylinder type storage nodes 48A are formed on the surface of the open regions 47, isolated from each other. In other words, the CMP process or the dry etch-back process is performed to remove portions of the conductive layer 48 formed outside the open regions 47, thereby forming the cylinder type storage nodes 48A over bottom surfaces and sidewalls of the open regions 47. After the storage node isolation process is performed, the storage nodes 48A are formed on the surface of the open regions 47 of the isolation layer 300. The storage nodes 48A are arranged in a zigzag pattern.

Figure 5D:
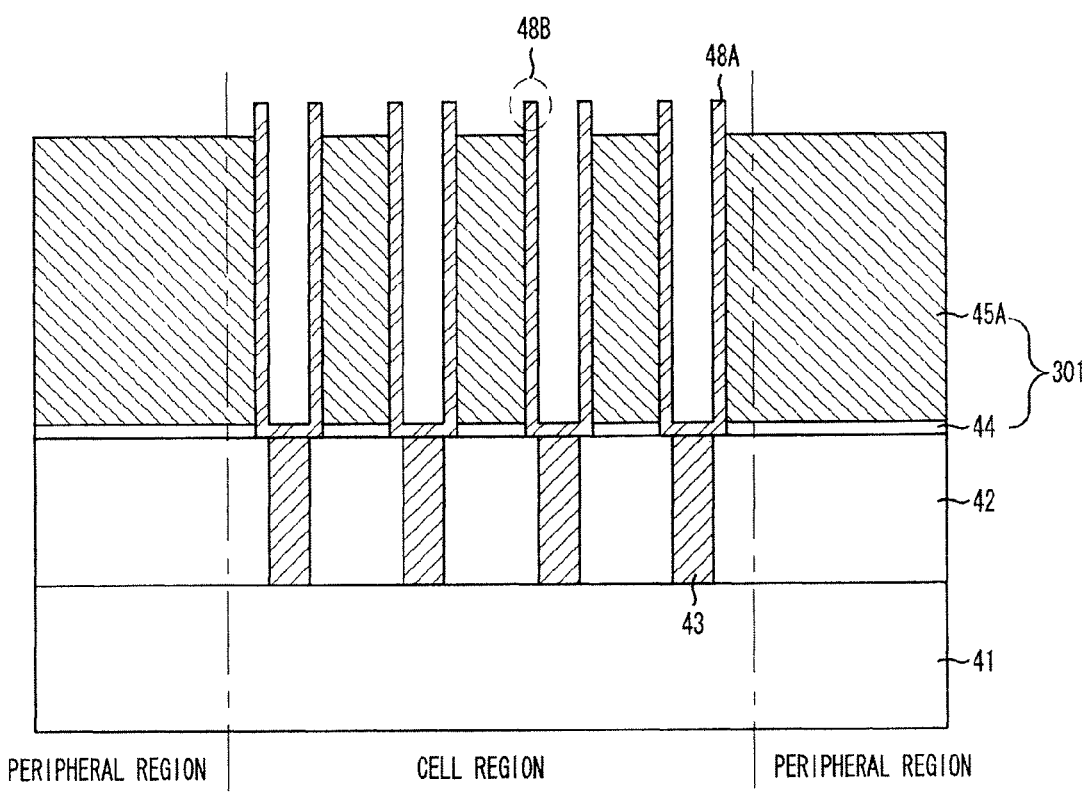

Referring to FIG. 5D, the patterned mould layer 45 is partially etched to form a remaining mould layer 45A. Thus, upper outer walls 48B of the storage nodes 48A are exposed. A remaining isolation layer 301 includes the remaining mould layer 45A and the patterned etch stop layer 44.

The patterned mould layer 45 is selectively etched using an oxide etchant because the patterned mould layer 45 includes an oxide-based material. For instance, a wet etch may be used. The wet etch may include performing a wet dip out process. The wet etch of the patterned mould layer 45 may include etching the patterned mould layer 45 to have a thickness ranging from approximately 200 nm to approximately 1,000 nm using a buffered oxide etchant (BOE) or a hydrogen fluoride (HF) solution. For instance, approximately 700 nm to approximately 800 nm of the patterned mould layer 45 may be etched.

After the patterned mould layer 45 is partially etched, the remaining isolation layer 301, including the stack structure of the patterned etch stop layer 44 and the remaining mould layer 45A, remains between adjacent storage nodes 48A. The upper outer walls 48B of the storage nodes 48A are exposed because portions of the patterned mould layer 45 are etched.

Figure 5E:
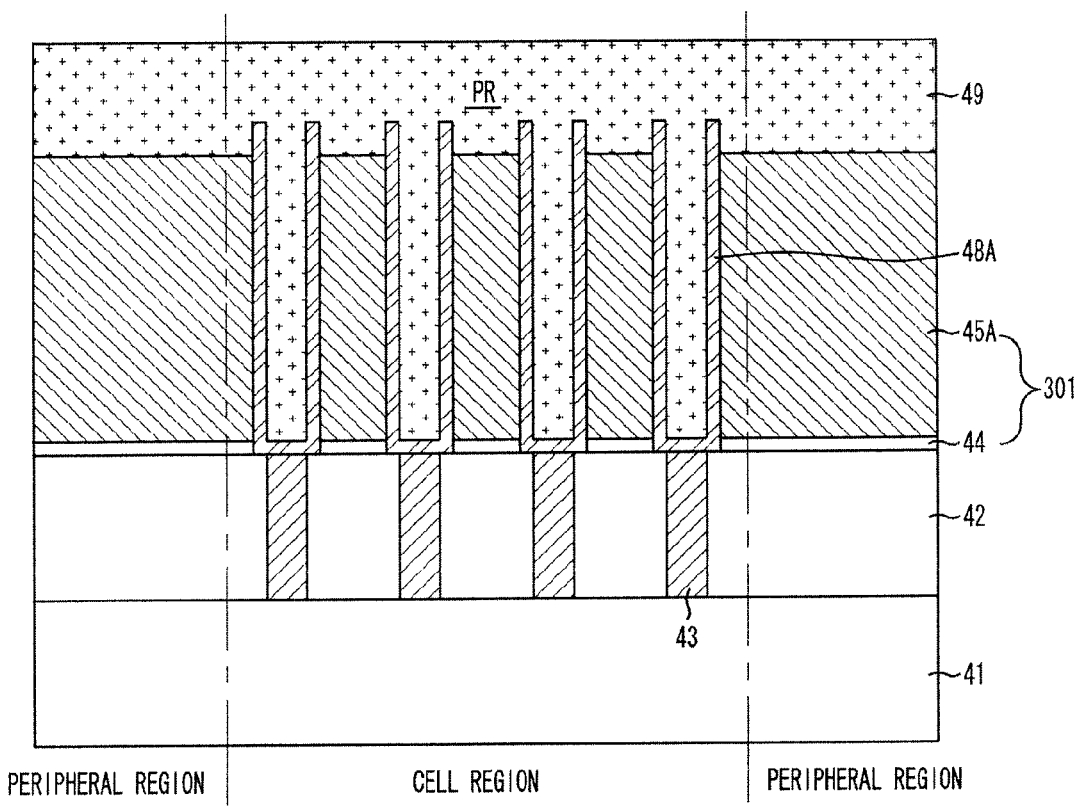

Referring to FIG. 5E, a sacrificial layer 49 is formed over the storage nodes 48A and the remaining isolation layer 301. The sacrificial layer 49 may include a material which may not be etched or which has a substantially slow etch rate in a wet etch solution for oxide during a subsequent wet dip out process of the remaining mould layer 45A. For instance, the sacrificial layer 49 may include a photoresist layer.

The photoresist layer is not easily etched by wet etch solutions for oxide, such as a BOE or a HF solution. The photoresist layer is easily removed through a dry aching process in an oxidation ambience including $O_2$ or ozone ($O_3$). The photoresist layer is formed to have a certain thickness sufficient to fill small and large spaces defined between the storage nodes 48A.

Figure 5F:
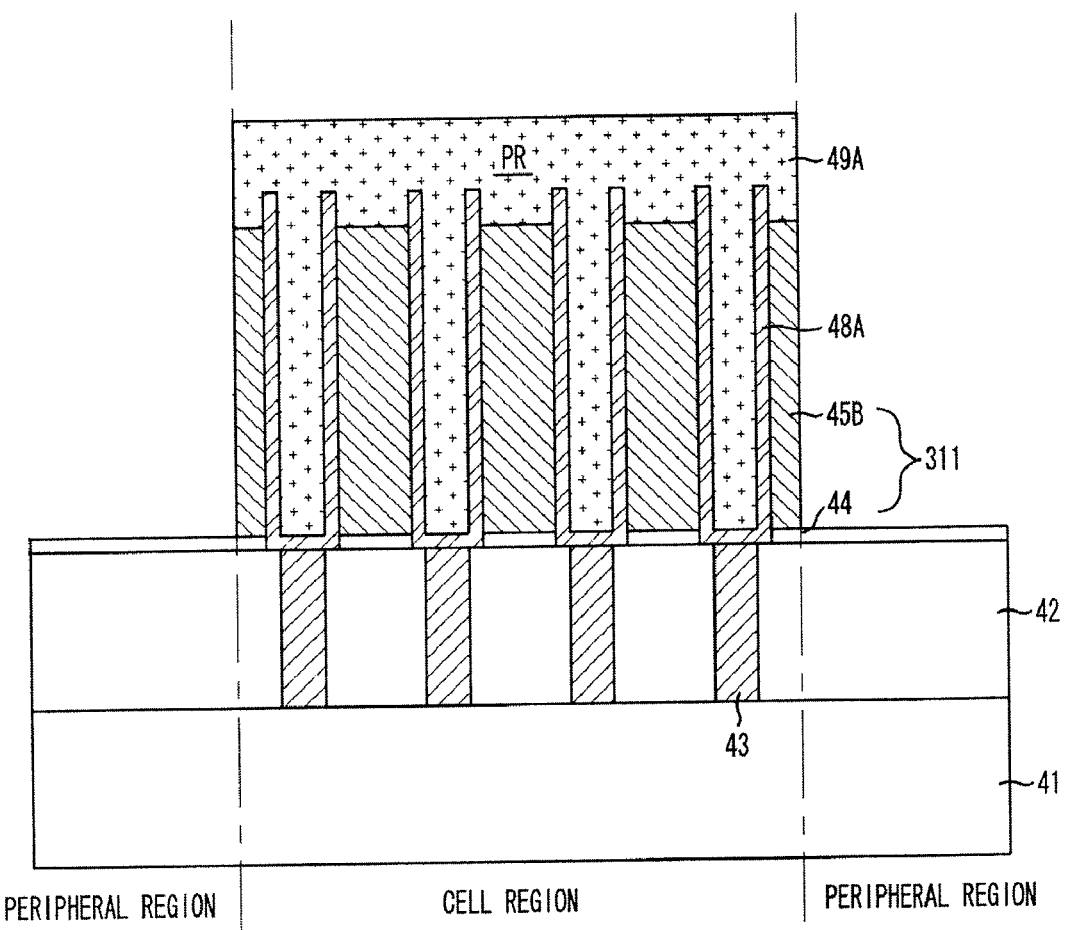

Referring to FIG. 5F, a photo-exposure and developing process is performed on the sacrificial layer 49, thereby forming a sacrificial pattern 49A. The sacrificial pattern 49A remains over the cell region.

The remaining mould layer 45A is etched using the sacrificial pattern 49A as an etch barrier. Thus, a mould pattern 45B is formed. The etching of the remaining mould layer 45A may include performing a dry etch process. Portions of the remaining mould layer 45A in the peripheral regions are etched away. Thus, the mould pattern 45B defines spaces around the cell region into which a wet etch solution may flow. The mould pattern 45B may be formed such that the mould pattern 45B remains in the cell region after the portions of the remaining mould layer 45A are etched in the peripheral regions. Alternatively, the mould pattern 45B may be formed such that portions of the remaining mould layer 45A remain over the patterned etch stop layer 44 at a certain thickness in the peripheral regions. An isolation pattern 311 includes the mould pattern 45B and the patterned etch stop layer 44.

Figure 5G:
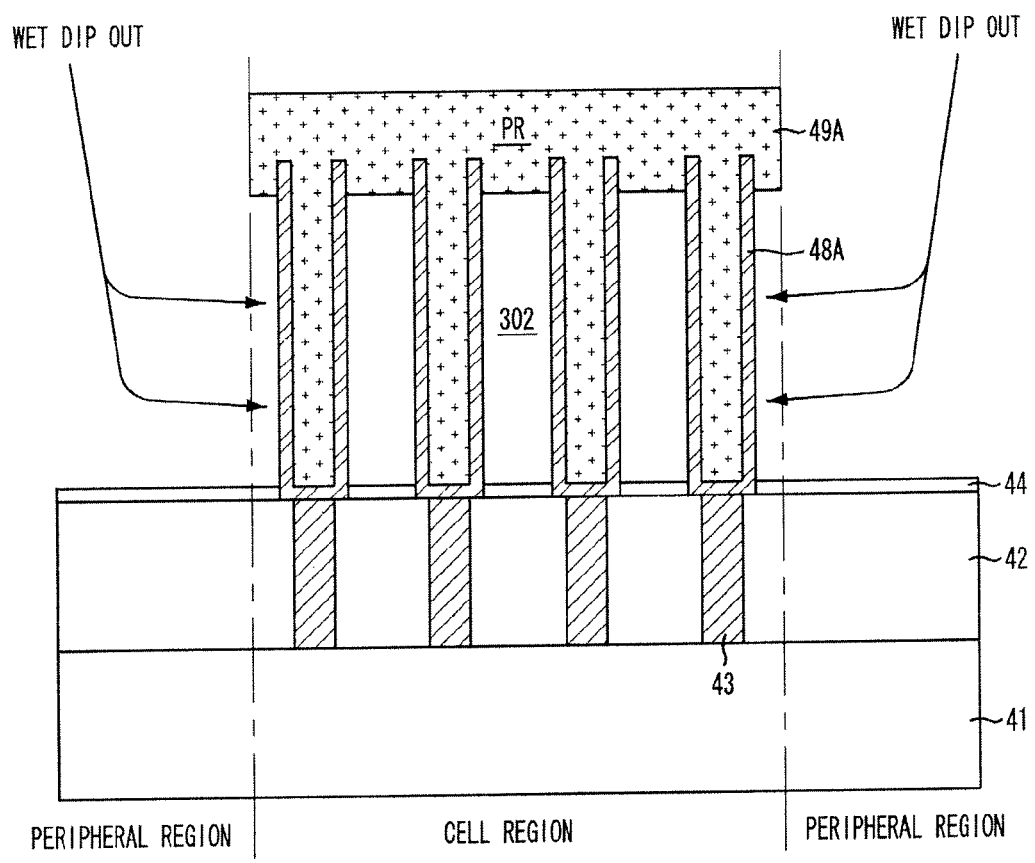

Referring to FIG. 5G, a wet etch process for oxide is performed. For instance, the wet etch process may include performing a wet dip out process. The mould pattern 45B including an oxide-based material remaining in the cell region is removed during the wet dip out process. A wet etch solution flows sideways into the spaces defined around the cell region and removes the mould pattern 45B. Thus, empty spaces 302 are formed. The sacrificial pattern 49A is not easily etched during a wet dip out process for oxide. Thus, the sacrificial pattern 49A decreases the likelihood of leaning storage nodes 48A. The wet dip out process may use a BOE or a HF solution as an oxide etchant. The wet dip out process is performed for a period of time sufficient to remove the mould pattern 45B. According to the third embodiment, the neighboring storage nodes 48A are supported by the sacrificial pattern 49A during the wet dip out process, and thus, the likelihood of leaning storage nodes 48A is reduced during a dry process which is performed after the wet dip out process.

Figure 5H:
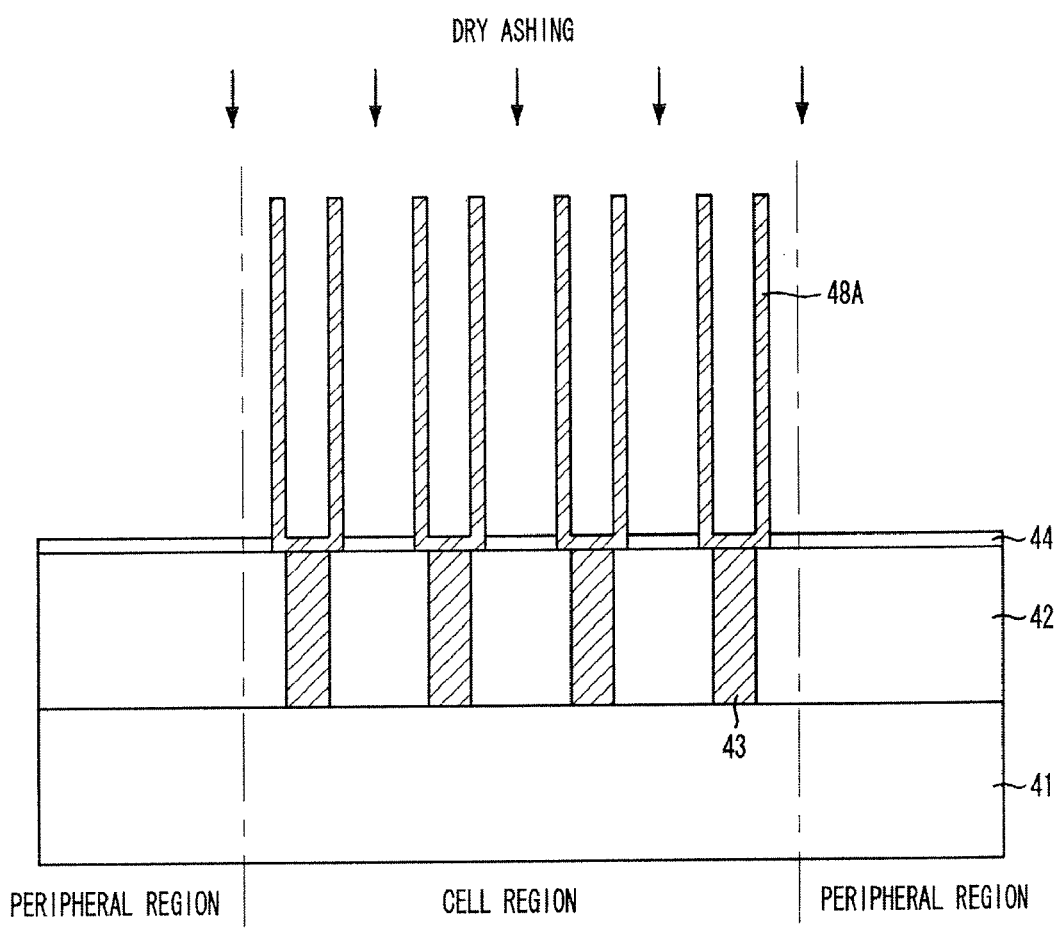

Referring to FIG. 5H, a photoresist ashing process is performed. The photoresist ashing process includes a dry ashing process. The sacrificial pattern 49A is removed using the dry ashing process. The sacrificial pattern 49A may be removed through a dry ashing using oxygen or ozone. The storage nodes 48A are not damaged because the dry ashing process is performed at a low temperature using oxygen.

Although not illustrated, subsequent dielectric layer and upper electrode formation processes are performed to form a cylinder type capacitor. The dielectric layer may include tantalum oxide ($Ta_2O_5$), aluminum oxide ($Al_2O_3$), titanium oxide ($TiO_2$), hafnium oxide ($HfO_2$), zirconium dioxide (ZrO$_2$), strontium titanate (STO), barium strontium titanate (BST), or a combination thereof. The upper electrode may include a TiN layer formed using a CVD method, a TiN layer formed using an ALD method, a Ru layer formed using a CVD method, a Ru layer formed using an ALD method, a Pt layer formed using an ALD method, an Ir layer formed using an ALD method, or a combination thereof.

FIGS. 6A to 6G illustrate cross-sectional views of a method for fabricating a cylinder type capacitor according to a fourth embodiment of the present invention.

Figure 6A:
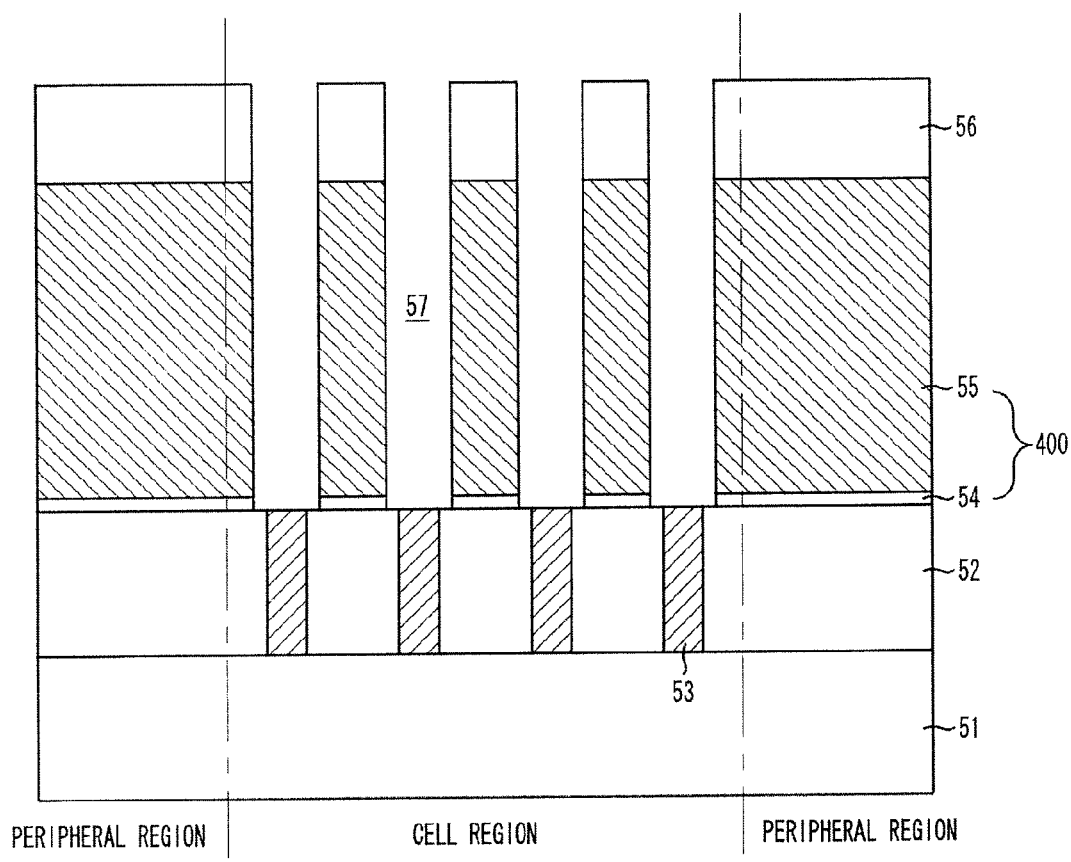
FIGS. 6A to 6G illustrate cross-sectional views of a method for fabricating a cylinder type capacitor according to a fourth embodiment of the present invention.

Referring to FIG. 6A, an insulation layer 52 is formed over a semi-finished substrate 51. The substrate 51 is divided into a cell region and peripheral regions. Storage node contact holes are formed in the insulation layer 52, and storage node contact plugs 53 are formed in the storage node contact holes. Although not illustrated, processes for forming transistors, word lines, and bit lines are generally performed before forming the insulation layer 52. The insulation layer 52 may include an undoped silicate glass (USG) layer and may be formed to have a thickness ranging from approximately 1,000 Å to approximately 3,000 Å. A patterned etch stop layer 54 is formed over the insulation layer 52. A patterned mould layer 55 is formed over the patterned etch stop layer 54.

The insulation layer 52 is etched using a storage node contact mask to form the storage node contact holes. A polysilicon layer fills the storage node contact holes and an etch-back process is performed to form the storage node contact plugs 53. Although not illustrated, barrier metals may be formed over the storage node contact plugs 53. The barrier metals may include titanium (Ti) or titanium nitride (TiN). An etch stop layer is formed over the insulation layer 52 and the storage node contact plugs 53. The etch stop layer may include a nitride-based material. For instance, the etch stop layer may include a silicon nitride (Si$_3$N$_4$) layer.

A mould layer is formed over the etch stop layer. The mould layer may include an insulation layer. For instance, an oxide-based layer such as a phosphosilicate glass (PSG) layer or a plasma enhanced tetraethyl orthosilicate (PETEOS) layer may be formed to have a certain thickness sufficient to maintain a necessary surface area for a desired dielectric capacitance. The mould layer may be formed in a double-layer structure including oxide-based layers. The double-layer structure may be formed such that an upper oxide-based layer has a smaller etch rate in a wet etch solution for oxide than a bottom oxide-based layer. For example, PSG may be formed and PETEOS may then be formed over the PSG in the double-layer structure.

A first photoresist layer is formed over the mould layer. A photo-exposure and developing process is performed on the first photoresist layer to form a first photoresist pattern 56. It is important for the first photoresist pattern to form openings in a zigzag pattern. The openings are formed in the first photoresist pattern 56 where subsequent storage nodes are to be formed. The mould layer is etched using the first photoresist pattern 56 as an etch barrier to form the patterned mould layer 55 and to form a plurality of open regions 57. The etch stop layer exposed by the open regions 57 is etched to form the patterned etch stop layer 54 and to expose upper surfaces of the storage node contact plugs 53.

The open regions 57 are formed to have a trench shape. The open regions 57 are also referred to as storage node holes because the subsequent storage nodes are formed on the surface of the open regions 57. The open regions 57 are formed in a zigzag pattern, mirroring the zigzag arrangement of the first photoresist pattern 56. The open regions 57 are formed in a zigzag pattern in substantially the same manner as the open regions 27 of the first embodiment shown in FIG. 3A. A stack structure, including the patterned etch stop layer 54 and the patterned mould layer 55 providing the open regions 57, is referred to as an isolation layer 400.

Figure 6B:
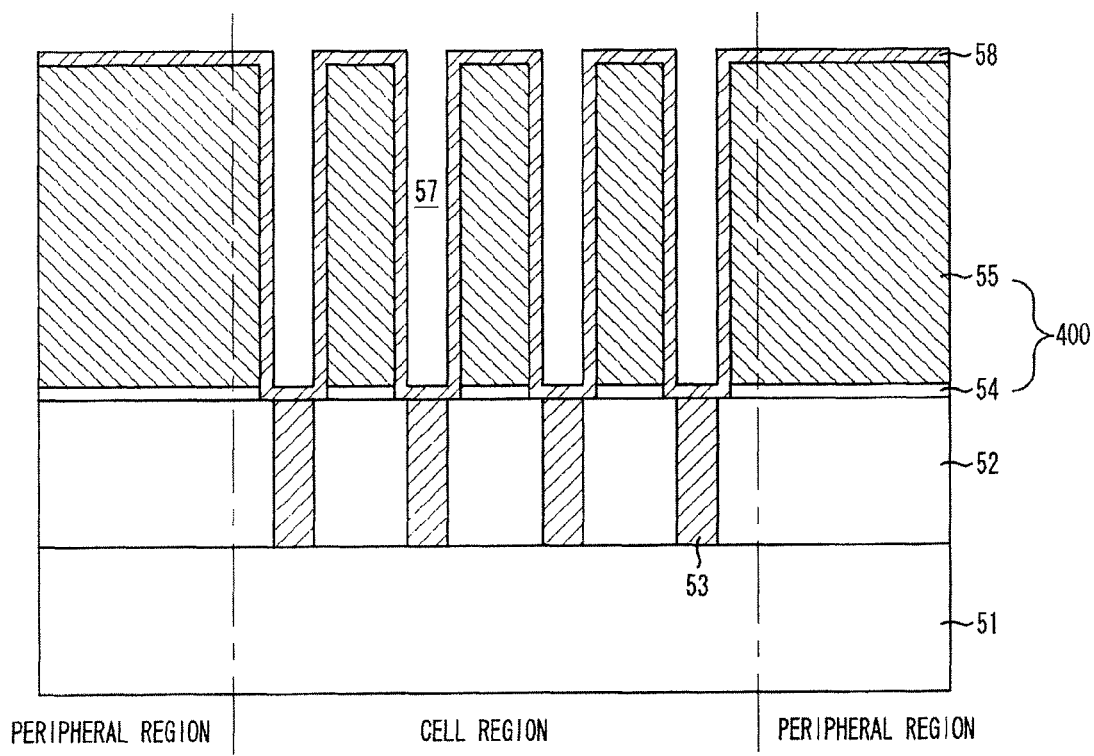

Referring to FIG. 6B, the first photoresist pattern 56 is removed. A conductive layer 58 for forming the storage nodes is formed over the isolation layer 400 and the open regions 57. The conductive layer 58 may include a metal electrode such as TiN or ruthenium (Ru). The conductive layer 58 may also include other materials besides TiN and Ru. The conductive layer 58 may be formed to have a thickness ranging from approximately 200 Å to approximately 400 Å using a chemical vapor deposition (CVD) method or an atomic layer deposition (ALD) method.

When forming the conductive layer 58 including TiN using the CVD method, a CVD TiN deposition method is performed using titanium tetrachloride (TiCl$_4$) as a source and using ammonia (NH$_3$) as a reaction gas at a temperature ranging from approximately 400° C. to approximately 700° C. When forming the conductive layer 58 including Ru, the ALD method or the CVD method is performed using Ru(EtCp)$_2$ as a source and using oxygen (O$_2$) gas as a reaction gas at a temperature ranging from approximately 200° C. to approximately 400° C. The conductive layer 58 for forming the storage nodes may include platinum (Pt) formed by the ALD method or, iridium (Ir) formed by the ALD method.

Figure 6C:
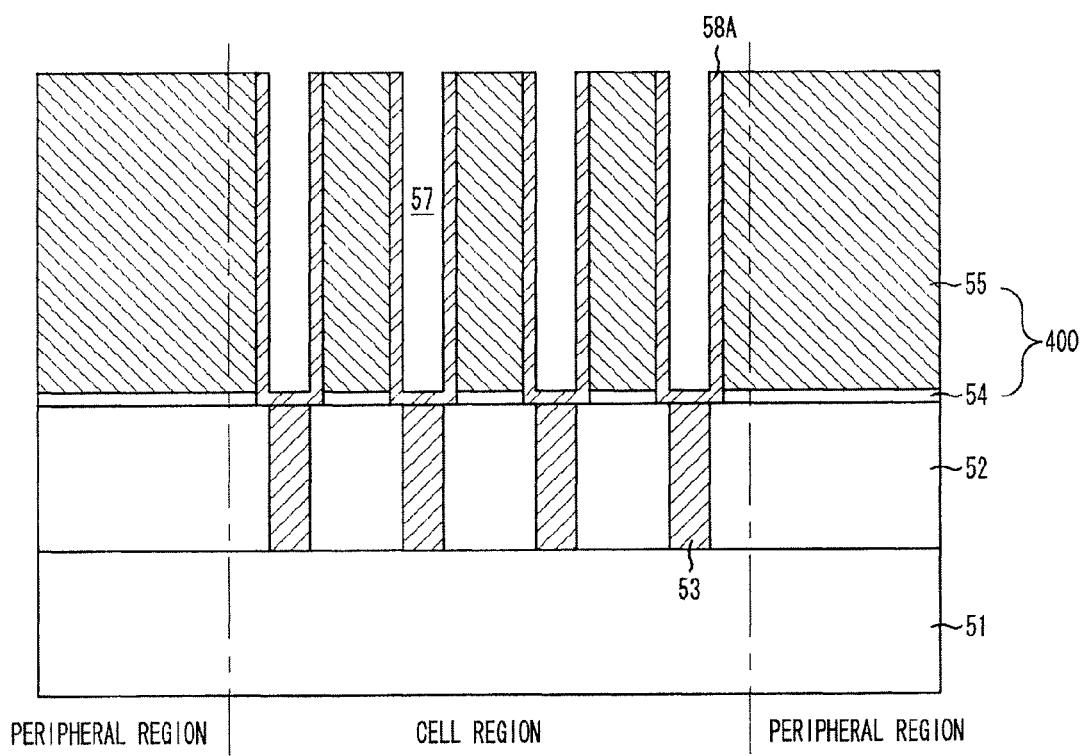

Referring to FIG. 6C, a storage node isolation process is performed. The storage node isolation process includes performing a dry etch-back process on the conductive layer 58. The storage node isolation process may include performing a CMP process or a dry etch-back process using a photoresist layer barrier or an oxide-based layer barrier when the conductive layer 58 includes TiN. Using the photoresist layer barrier or the oxide-based layer barrier may reduce contamination in the open regions 57 during the storage node isolation process.

The storage node isolation process is performed until top surfaces of the patterned mould layer 55 are exposed. Thus, cylinder type storage nodes 58A are formed on the surface of the open regions 57, isolated from each other. In other words, the CMP process or the dry etch-back process is performed to remove portions of the conductive layer 58 formed outside the open regions 57, thereby forming the cylinder type storage nodes 58A over bottom surfaces and sidewalls of the open regions 57. The storage nodes 58A are formed on the surface of the open regions 57 of the isolation layer 400. The storage nodes 58A are formed in a zigzag pattern.

Figure 6D:
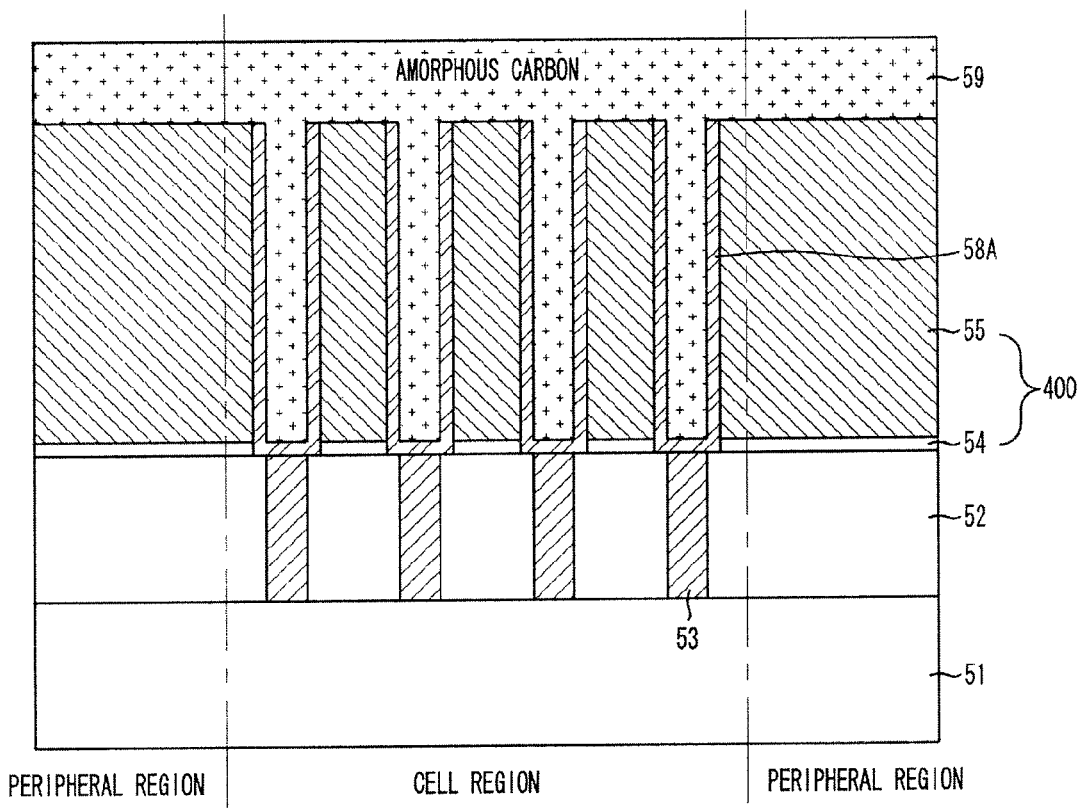

Referring to FIG. 6D, a sacrificial layer 59 is formed over the storage nodes 58A and the isolation layer 400. The sacrificial layer 59 may include a material which may not be etched or which has a substantially slow etch rate in a wet etch solution for oxide during a subsequent wet dip out process of the patterned mould layer 55. For instance, the sacrificial layer 59 may include an amorphous carbon layer.

The amorphous carbon layer may be formed using a plasma-based deposition method, such as a plasma enhanced chemical vapor deposition (PECVD) method or a plasma enhanced atomic layer deposition (PEALD) method. The amorphous carbon layer is not easily etched by wet etch solutions for oxide, such as a BOE or a HF solution. The amorphous carbon layer is easily removed by a dry ashing process in an oxidation ambience including O$_2$ or ozone (O$_3$). The amorphous carbon layer used as the sacrificial layer 59 is formed at a temperature ranging from approximately 200° C. to approximately 500° C.

The sacrificial layer 59 is formed to a certain thickness sufficient to fill a space defined between neighboring storage nodes 58A. The sacrificial layer 59 may be formed to cover the substrate structure without controlling the thickness of the sacrificial layer 59 because a dry etch-back process of the sacrificial layer 59 is omitted in the fourth embodiment, unlike the first embodiment.

Figure 6E:
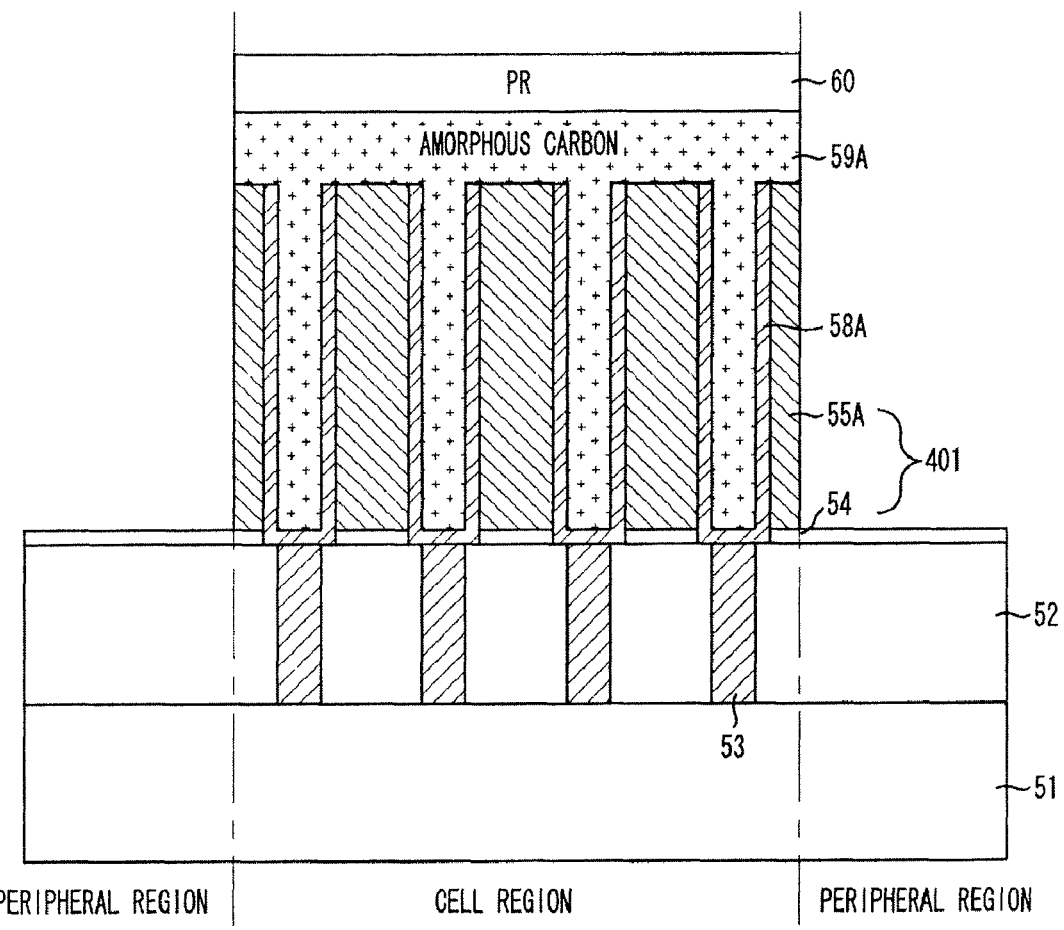

Referring to FIG. 6E, a second photoresist layer is formed over the sacrificial layer 59. A photo-exposure and developing process is performed on the second photoresist layer to form a second photoresist pattern 60. The second photoresist pattern 60 covers the cell region but exposes the peripheral regions of the substrate structure.

The sacrificial layer 59 is etched using the second photoresist pattern 60 as an etch barrier. Thus, a sacrificial pattern 59A is formed. The sacrificial pattern 59A remains in the cell region because portions of the sacrificial layer 59 in the peripheral regions are etched. The patterned mould layer 55 is etched after the sacrificial pattern 59A is formed, thereby forming a mould pattern 55A. The etching of the patterned mould layer 55 may include performing a dry etch process. Portions of the patterned mould layer 55 in the peripheral regions are etched. Thus, the mould pattern 55A defines spaces around the cell region into which a wet etch solution may flow. The mould pattern 55A may be formed such that the mould pattern 55A remains in the cell region after the portions of the patterned mould layer 55 are etched in the peripheral regions. Alternatively, the mould pattern 55A may be formed such that portions of the patterned mould layer 55 remain over the patterned etch stop layer 54 at a certain thickness in the peripheral regions. An isolation pattern 401 includes the mould pattern 55A and the patterned etch stop layer 54.

Figure 6F:
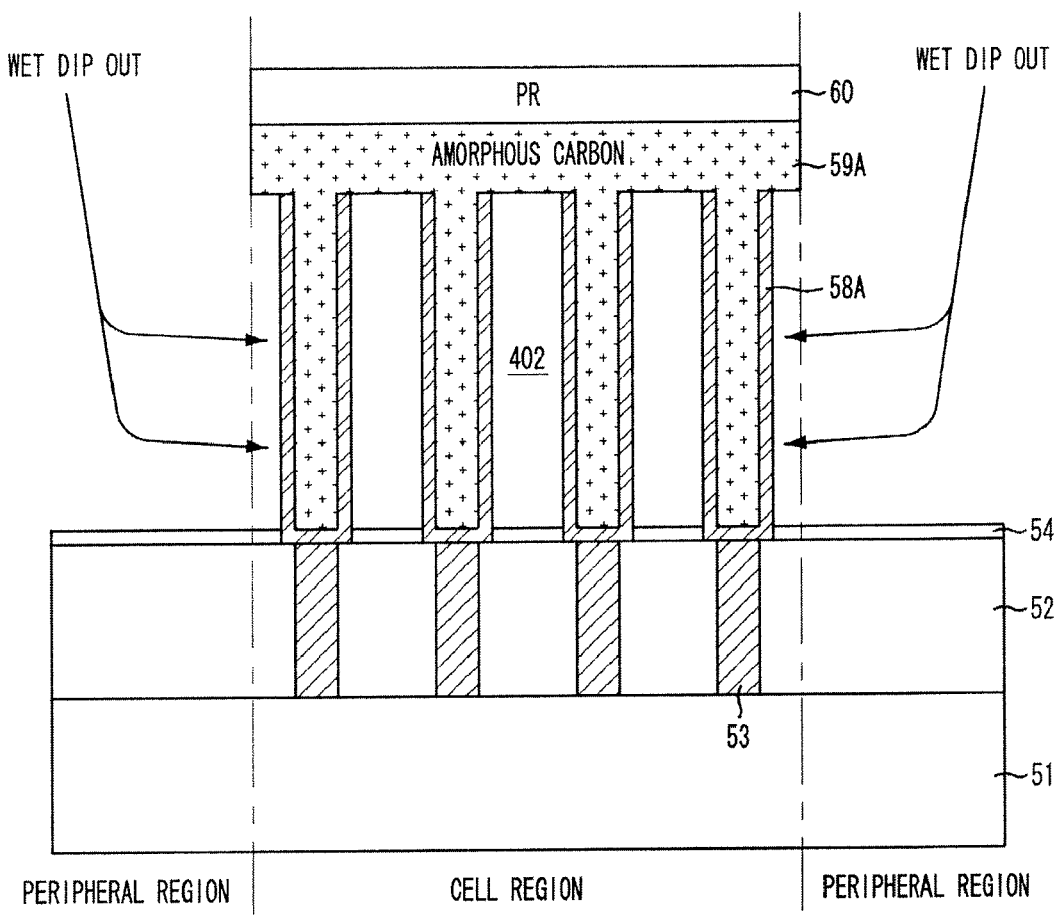

Referring to FIG. 6F, a wet etch process for oxide is performed. For instance, the wet etch process may include performing a wet dip out process. The mould pattern 55A including an oxide-based material is removed during the wet dip out process. A wet etch solution flows sideways into the spaces defined around the cell region and removes the mould pattern 55A. Thus, empty spaces 402 are formed between the storage nodes 58A. The sacrificial pattern 59A is not easily etched during a wet dip out process for oxide. Thus, the sacrificial pattern 59A decreases the likelihood of leaning storage nodes 58A. The wet dip out process may use a BOE or a HF solution as an oxide etchant. The wet dip out process is performed for a period of time sufficient to remove the mould pattern 55A. Neighboring storage nodes 58A are supported by the sacrificial pattern 59A during the wet dip out process, and thus, the likelihood of leaning storage nodes 58A is reduced during a dry process which is performed after the wet dip out process.

Figure 6G:
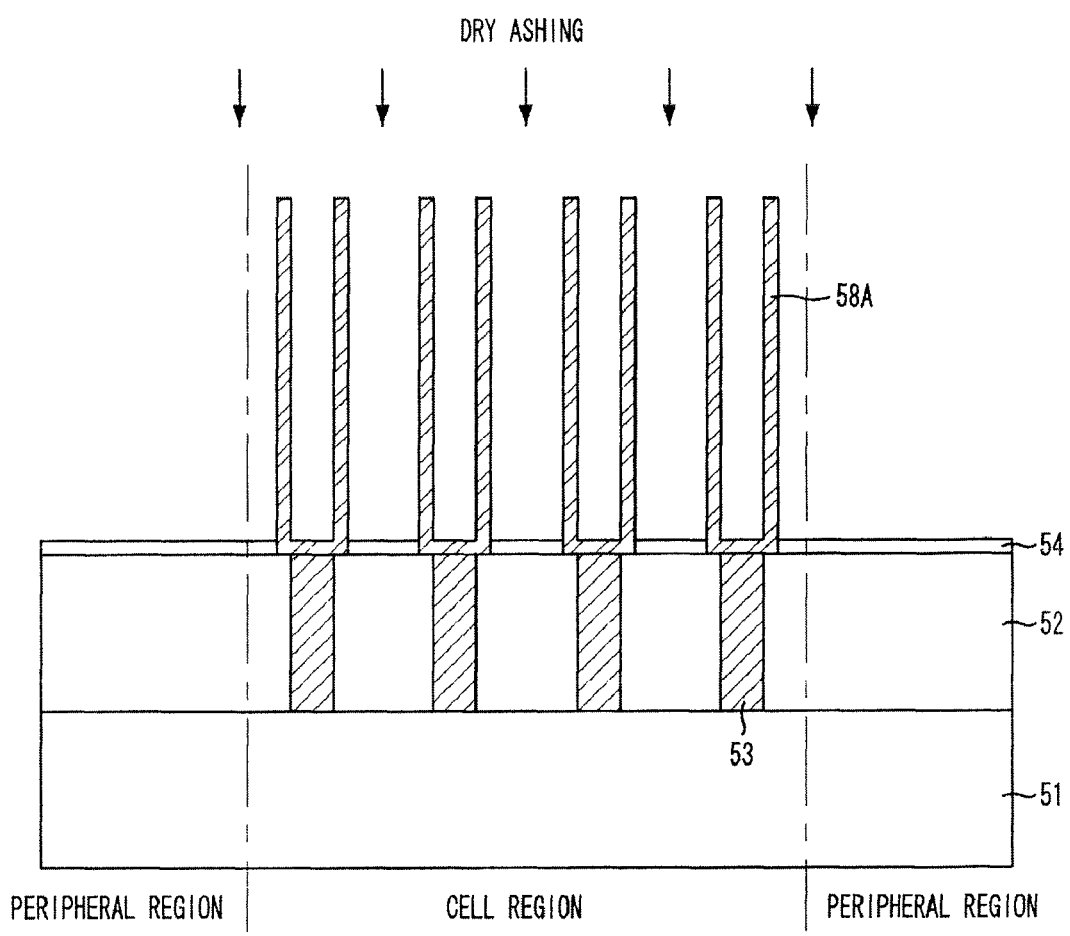

Referring to FIG. 6G, a photoresist ashing process is performed. The photoresist ashing process includes a dry ashing process. The second photoresist pattern 60 and the sacrificial pattern 59A are simultaneously removed using the dry ashing process. The sacrificial pattern 59A including amorphous carbon may be removed at substantially the same time as the second photoresist pattern 60 because amorphous carbon can be removed by a dry ashing using oxygen or ozone. The storage nodes 58A are not damaged because the dry ashing process is performed at a low temperature using oxygen.

Although not illustrated, subsequent dielectric layer and upper electrode formation processes are performed to form a cylinder type capacitor. The dielectric layer may include tantalum oxide ($Ta_2O_5$), aluminum oxide ($Al_2O_3$), titanium oxide ($TiO_2$), hafnium oxide ($HfO_2$), zirconium dioxide ($ZrO_2$), strontium titanate (STO), barium strontium titanate (BST), or a combination thereof. The upper electrode may include a TiN layer formed using a CVD method, a TiN layer formed using an ALD method, a Ru layer formed using a CVD method, a Ru layer formed using an ALD method, a Pt layer formed using an ALD method, an Ir layer formed using an ALD method, or a combination thereof.

FIGS. 7A to 7G illustrate cross-sectional views of a method for fabricating a cylinder type capacitor according to a fifth embodiment of the present invention.

Figure 7A:
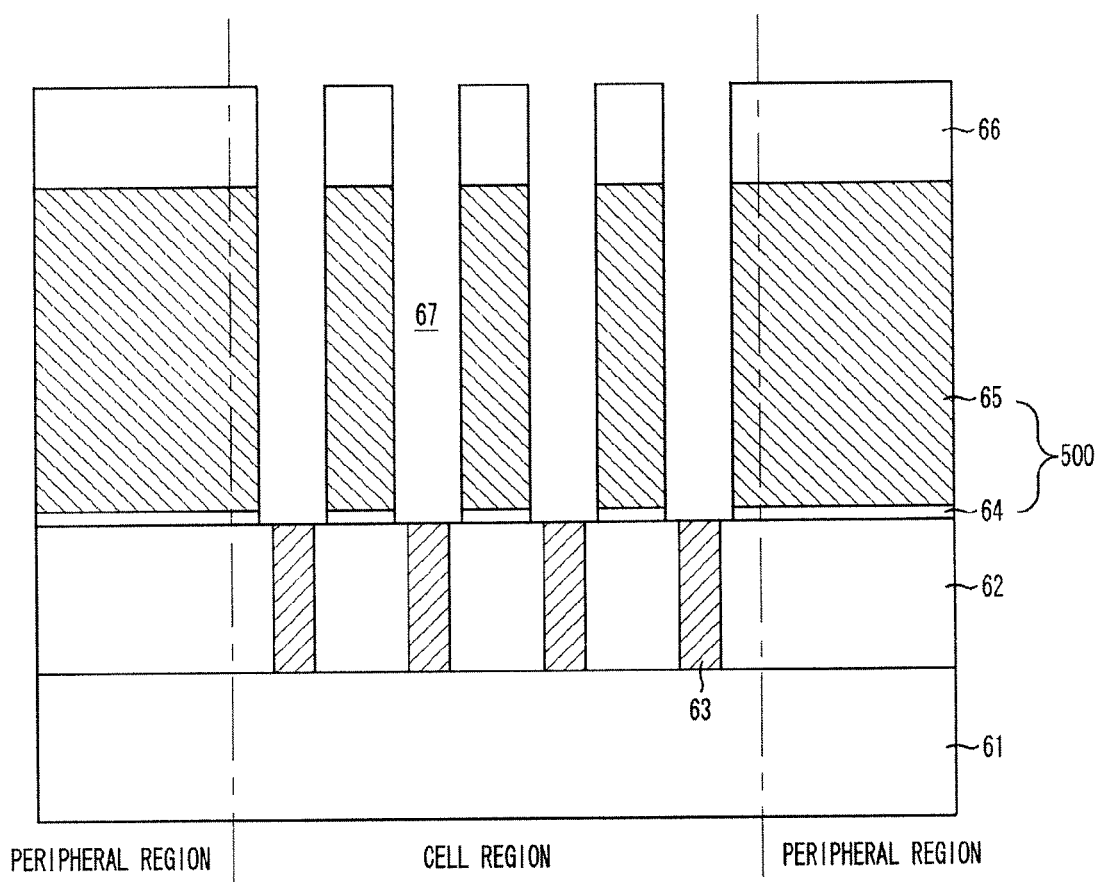
FIGS. 7A to 7G illustrate cross-sectional views of a method for fabricating a cylinder type capacitor according to a fifth embodiment of the present invention.

Referring to FIG. 7A, an insulation layer 62 is formed over a semi-finished substrate 61. The substrate 61 is divided into a cell region and peripheral regions. Storage node contact holes are formed in the insulation layer 62, and storage node contact plugs 63 are formed in the storage node contact holes. Although not illustrated, processes for forming transistors, word lines, and bit lines are generally performed before forming the insulation layer 62. The insulation layer 62 may include an undoped silicate glass (USG) layer and may be formed to a thickness ranging from approximately 1,000 Å to approximately 3,000 Å. A patterned etch stop layer 64 is formed over the insulation layer 62. A patterned mould layer 65 is formed over the patterned etch stop layer 64.

The insulation layer 62 is etched using a storage node contact mask to form the storage node contact holes. A polysilicon layer fills the storage node contact holes and an etch-back process is performed to form the storage node contact plugs 63. Although not illustrated, barrier metals may be formed over the storage node contact plugs 63. The barrier metals may include titanium (Ti) or titanium nitride (TiN). An etch stop layer is formed over the insulation layer 62 and the storage node contact plugs 63. The etch stop layer may include a nitride-based material. For instance, the etch stop layer may include a silicon nitride ($Si_3N_4$) layer.

A mould layer is formed over the etch stop layer. The mould layer may include an insulation layer. For instance, an oxide-based layer such as a phosphosilicate glass (PSG) layer or a plasma enhanced tetraethyl orthosilicate (PETEOS) layer may be formed to have a certain thickness sufficient to maintain a necessary surface area for a desired dielectric capacitance. The mould layer may be formed in a double-layer structure including oxide-based layers. The double-layer structure may be formed such that an upper oxide-based layer has a smaller etch rate in a wet etch solution for oxide than a bottom oxide-based layer. For example, PSG may be formed and PETEOS may be then formed over the PSG in the double-layer structure.

A photoresist layer is formed over the mould layer. A photo-exposure and developing process is performed on the photoresist layer to form a photoresist pattern 66. It is important for the photoresist pattern 66 to define openings in a zigzag pattern. The openings are defined in the photoresist pattern 66 where subsequent storage nodes are to be formed. The mould layer is etched using the photoresist pattern 66 as an etch barrier to form the patterned mould layer 65 and to form a plurality of open regions 47. The etch stop layer exposed by the open regions 67 is etched to form the patterned etch stop layer 64 and to expose upper surfaces of the storage node contact plugs 63.

The open regions 67 are formed to have a trench shape. The open regions 67 are also referred to as storage node holes because the subsequent storage nodes are formed on the surface of the open regions 67. The open regions 67 are formed in a zigzag pattern, mirroring the zigzag arrangement of the photoresist pattern 66. The open regions 67 are formed in a zigzag pattern in substantially the same manner as the open regions 27 of the first embodiment shown in FIG. 3A. A stack structure, including the patterned etch stop layer 64 and the patterned mould layer 65 providing the open regions 67, is referred to as an isolation layer 500.

Figure 7B:
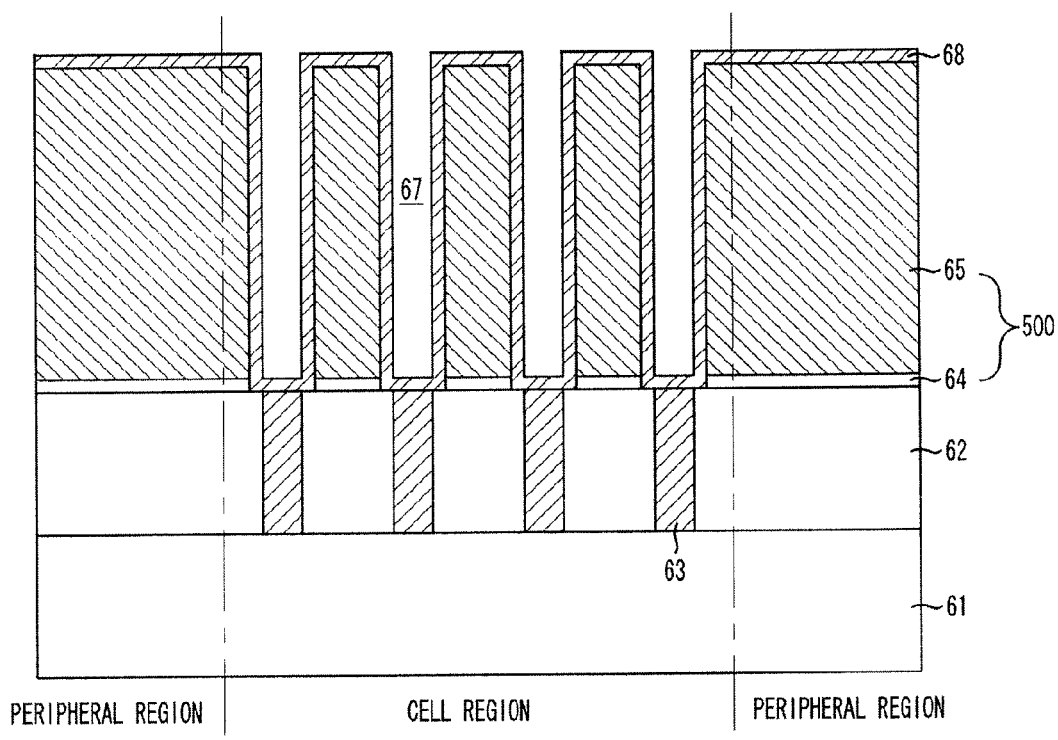

Referring to FIG. 7B, the photoresist pattern 66 is removed. A conductive layer 68 for forming the storage nodes is formed over the isolation layer 500 and the open regions 67. The conductive layer 68 may include a metal electrode such as TiN or ruthenium (Ru). The conductive layer 68 may also include other materials besides TiN and Ru. The conductive layer 68 may be formed to a thickness ranging from approximately 200 Å to approximately 400 Å using a chemical vapor deposition (CVD) method or an atomic layer deposition (ALD) method.

When forming the conductive layer 68 including TiN using the CVD method, a CVD TiN deposition method is performed using titanium tetrachloride ($TiCl_4$) as a source and using ammonia ($NH_3$) as a reaction gas at a temperature ranging from approximately 400° C. to approximately 700° C. When forming the conductive layer 68 including Ru, the ALD method or the CVD method is performed using $Ru(EtCp)_2$ as a source and using oxygen ($O_2$) gas as a reaction gas at a temperature ranging from approximately 200° C. to approximately 400° C. The conductive layer 68 for forming the storage nodes may include platinum (Pt) formed by the ALD method or iridium (Ir) formed by the ALD method.

Figure 7C:
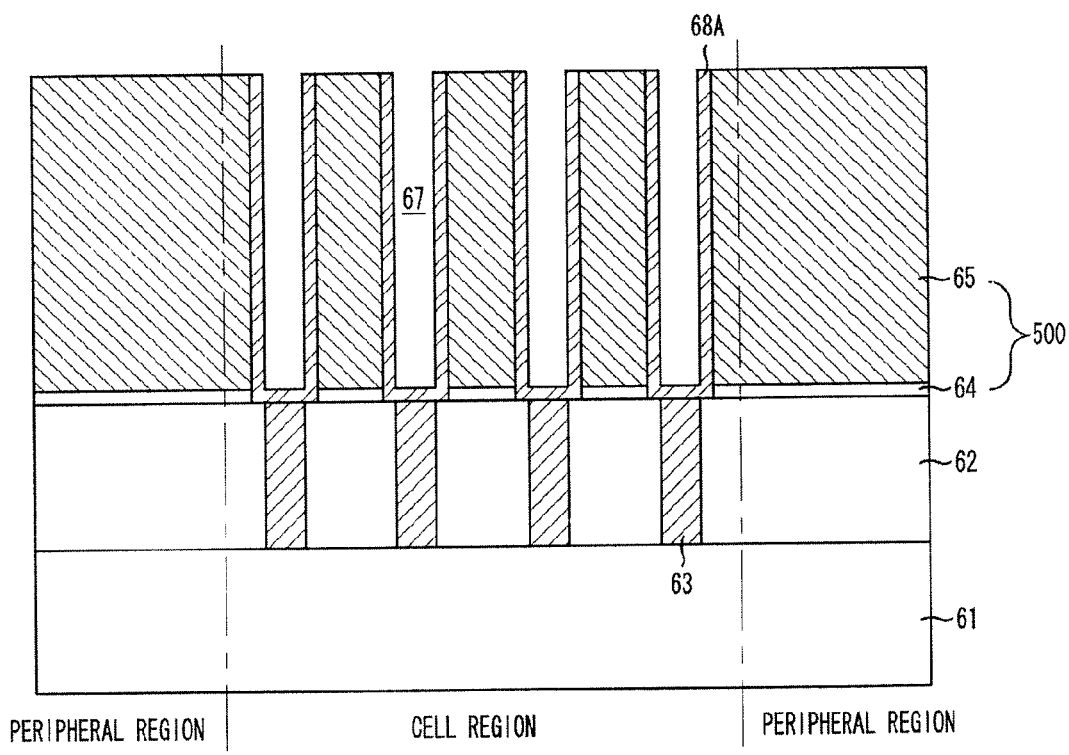

Referring to FIG. 7C, a storage node isolation process is performed. The storage node isolation process includes performing a dry etch-back process on the conductive layer 68. The storage node isolation process may include performing a CMP process or a dry etch-back process using a photoresist layer barrier or an oxide-based layer barrier when the conductive layer 68 includes TiN. Using the photoresist layer barrier or the oxide-based layer barrier may reduce contamination in the open regions 67 during the storage node isolation process.

The storage node isolation process is performed until top surfaces of the patterned mould layer 65 are exposed. Thus, cylinder type storage nodes 68A are formed on the surface of the open regions 67, isolated from each other. In other words, the CMP process or the dry etch-back process is performed to remove portions of the conductive layer 68 formed outside the open regions 67, thereby forming the cylinder type storage nodes 68A over bottom surfaces and sidewalls of the open regions 67. The storage nodes 68A are formed on the surface of the open regions 67 of the isolation layer 500. The storage nodes 68A are formed in a zigzag pattern.

Figure 7D:
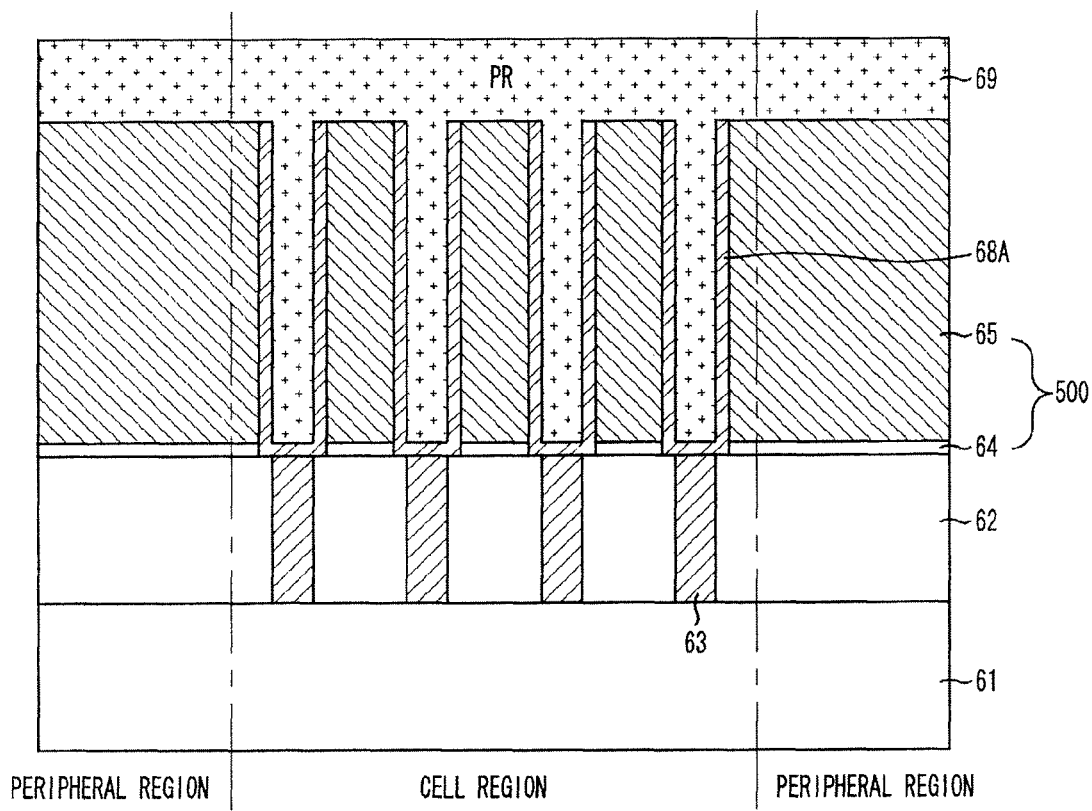

Referring to FIG. 7D, a sacrificial layer 69 is formed over the storage nodes 68A and the isolation layer 500. The sacrificial layer 69 may include a material which may not be etched or which has a substantially slow etch rate in a wet etch solution for oxide during a subsequent wet dip out process of the patterned mould layer 65. For instance, the sacrificial layer 69 may include a photoresist layer.

The photoresist layer is not easily etched by wet etch solutions for oxide, such as a BOE or a HF solution. The photoresist layer is easily removed through a dry aching process in an oxidation ambience including $O_2$ or ozone ($O_3$). The photoresist layer is formed to a certain thickness sufficient to fill a space defined between the storage nodes 68A. The sacrificial layer 69 may be formed to cover the substrate structure without controlling the thickness of the sacrificial layer 69 because a dry etch-back process of the sacrificial layer 69 is omitted in the fifth embodiment, unlike the first embodiment.

Figure 7E:
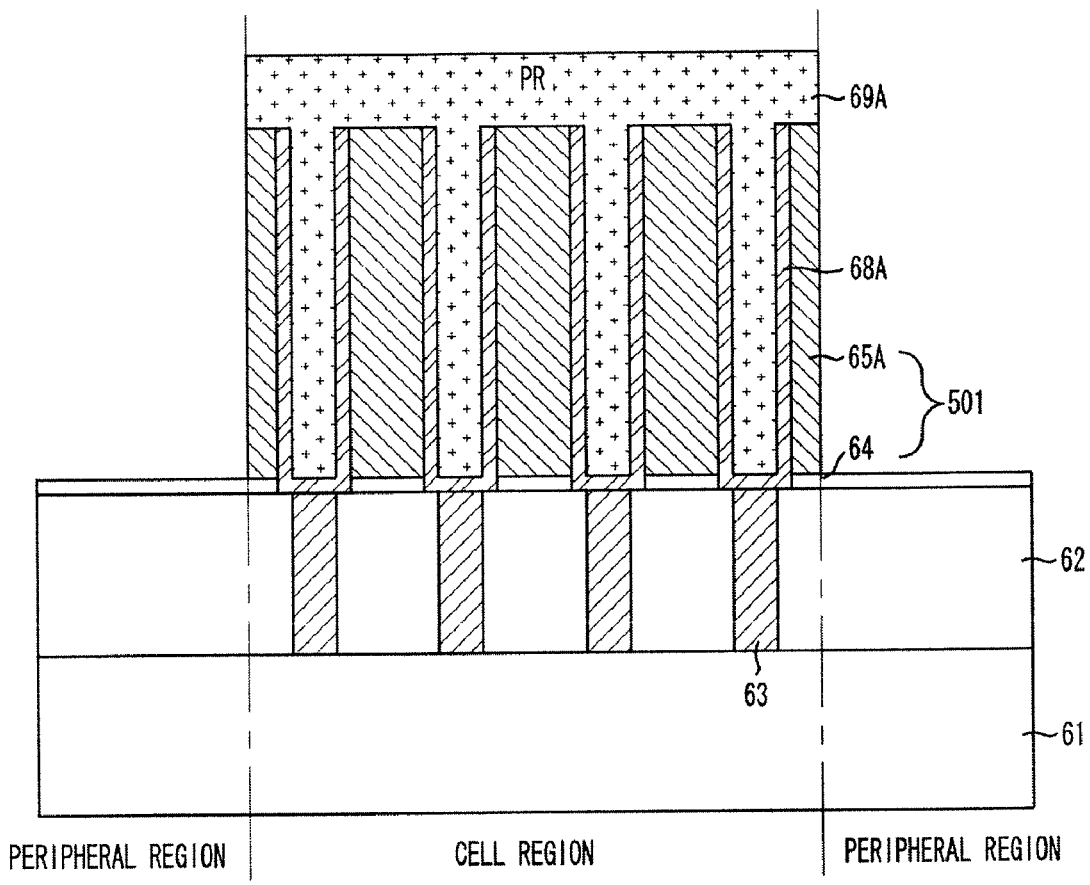

Referring to FIG. 7E, a photo-exposure and developing process is performed on the sacrificial layer 69, thereby forming a sacrificial pattern 69A. The sacrificial pattern 69A remains over the cell region and exposes the peripheral regions.

The patterned mould layer 65 is etched using the sacrificial pattern 69A as an etch barrier. Thus, a mould pattern 65A is formed. The etching of the patterned mould layer 65 may include performing a dry etch process. Portions of the patterned mould layer 65 in the peripheral regions are etched. Thus, the mould pattern 65A defines spaces around the cell region into which a wet etch solution may flow. The mould pattern 65A may be formed such that the mould pattern 65A remains in the cell region after the portions of the patterned mould layer 65 are etched in the peripheral regions. Alternatively, the mould pattern 65A may be formed such that portions of the patterned mould layer 65 remain over the patterned etch stop layer 64 at a certain thickness in the peripheral regions. Isolation pattern 501 includes the mould pattern 65A and the patterned etch stop layer 64.

Figure 7F:
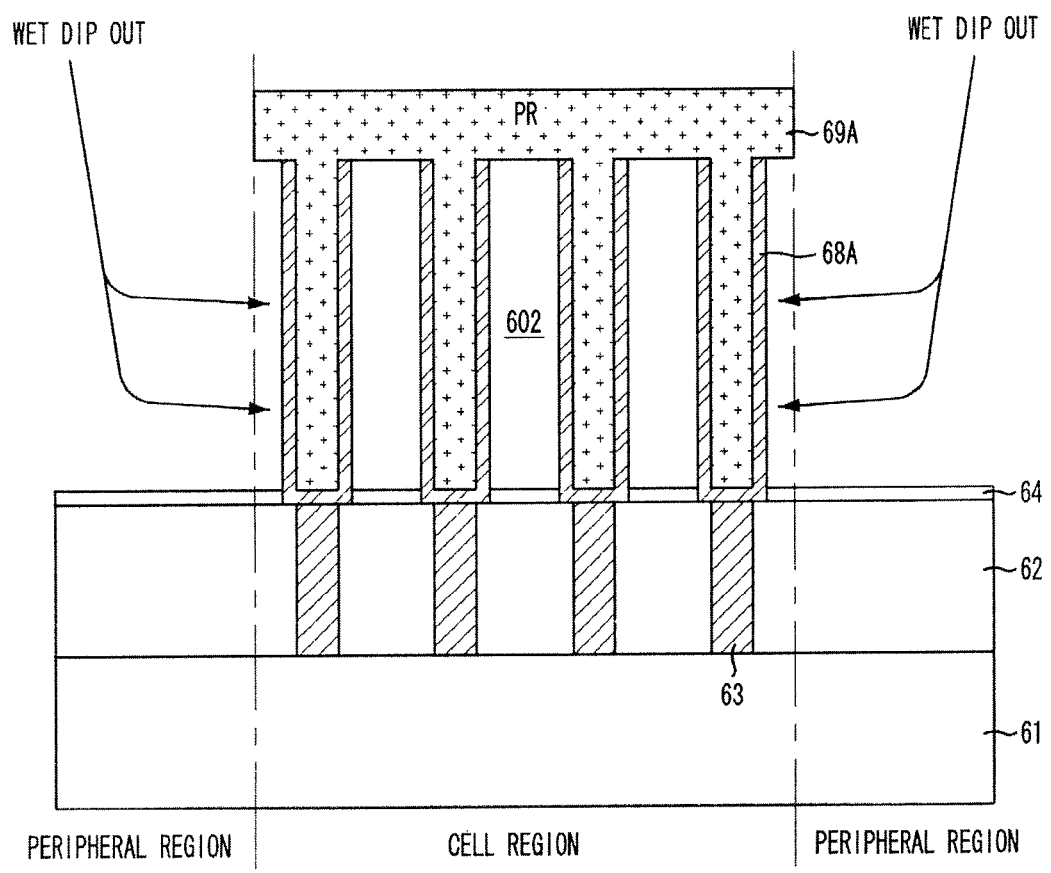

Referring to FIG. 7F, a wet etch process for oxide is performed. For instance, the wet etch process may include performing a wet dip out process. The mould pattern 65A including an oxide-based material remaining in the cell region is removed during the wet dip out process. A wet etch solution flows sideways into the spaces defined around the cell region and removes the mould pattern 65A. Thus, empty spaces 602 are formed. The sacrificial pattern 69A is not easily etched during a wet dip out process for oxide. Thus, the sacrificial pattern 69A decreases the likelihood of leaning storage nodes 68A. The wet dip out process may use a BOE or a HF solution as an oxide etchant. The wet dip out process is performed for a period of time sufficient to remove the mould pattern 65A. The neighboring storage nodes 68A are supported by the sacrificial pattern 69A during the wet dip out process, and thus, the likelihood of leaning storage nodes 68A is reduced during a dry process which is performed after the wet dip out process.

Figure 7G:
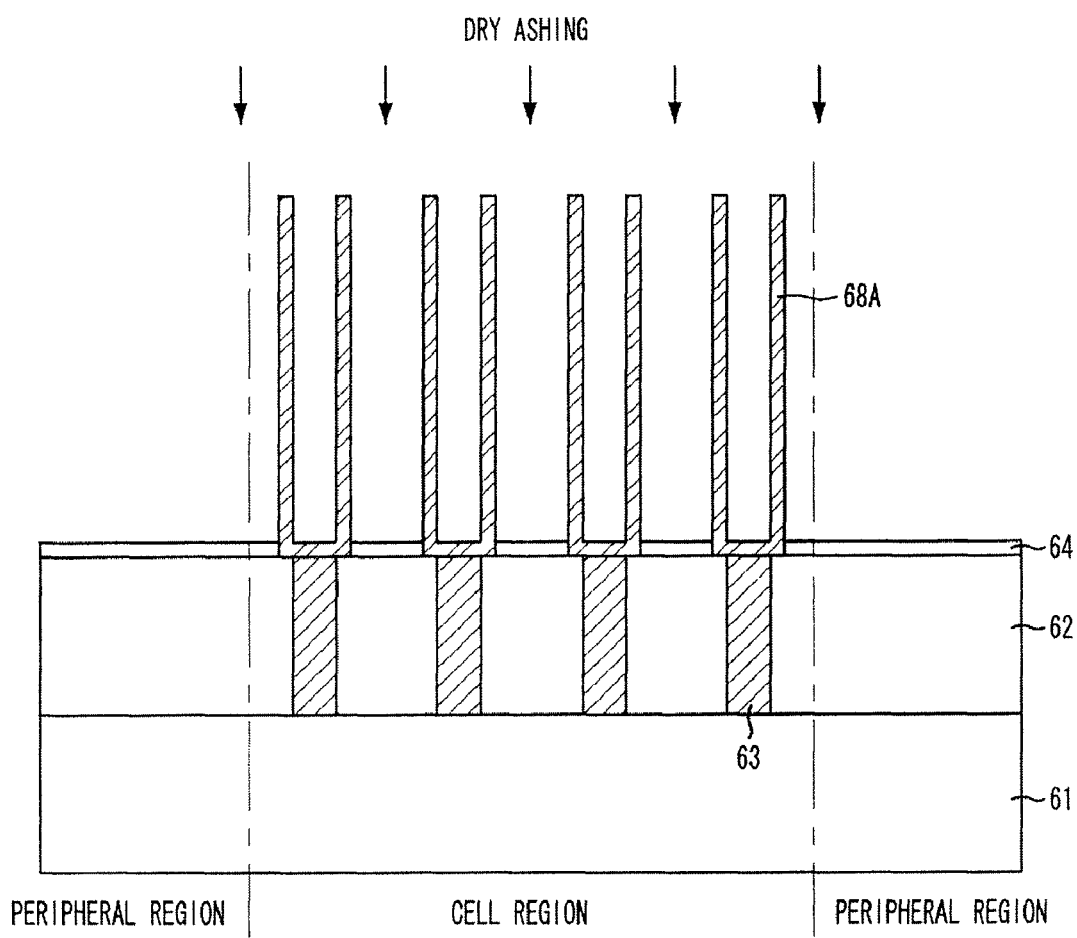

Referring to FIG. 7G, a photoresist ashing process is performed. The photoresist ashing process includes a dry ashing process. The sacrificial pattern 69A is removed using the dry ashing process. The sacrificial pattern 69A may be removed through a dry ashing using oxygen or ozone. The storage nodes 68A are not damaged because the dry ashing process is performed at a low temperature using oxygen.

Although not illustrated, subsequent dielectric layer and upper electrode formation processes are performed to form a cylinder type capacitor. The dielectric layer may include tantalum oxide ($Ta_2O_5$), aluminum oxide ($Al_2O_3$), titanium oxide ($TiO_2$), hafnium oxide ($HfO_2$), zirconium dioxide ($ZrO_2$), strontium titanate (STO), barium strontium titanate (BST), or a combination thereof. The upper electrode may include a TiN layer formed using a CVD method, a TiN layer formed using an ALD method, a Ru layer formed using a CVD method, a Ru layer formed using an ALD method, a Pt layer formed using an ALD method, an Ir layer formed using an ALD method, or a combination thereof.

According to the second through fifth embodiments of the present invention, the sacrificial layer formed in the large space between the storage nodes may not have to be removed by the dry etch-back process. The sacrificial layer may decrease the occurrence of leaning storage nodes, regardless of the step coverage characteristic of the sacrificial layer in accordance with the deposition methods such as a PECVD method or a PEALD method. In other words, the process shown in the first embodiment may be varied according to the step coverage characteristic of the sacrificial layer, in which the dry etch-back process is performed on the sacrificial layer to form the sidewall shaped sacrificial layer around the upper outer walls of the storage nodes.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a capacitor, comprising:
    forming an isolation layer over a cell region and a peripheral region of a substrate, the isolation layer forming a plurality of open regions in the cell region, wherein the substrate is divided into the cell region and the peripheral region;
    forming storage nodes on surfaces of the open regions;
    forming a sacrificial pattern over the isolation layer, wherein the sacrificial pattern covers the cell region;
    etching the isolation layer in the peripheral region to expose side portions of the resultant structure obtained after forming the sacrificial pattern in the cell region;
    with the sacrificial pattern supporting the storage nodes, removing the isolation layer in the cell region; and
    removing the sacrificial pattern.

2. The method of claim 1, wherein the sacrificial pattern and the isolation layer each comprise a material having an etch rate different from each other.

3. The method of claim 1, wherein the isolation layer comprises an oxide-based layer and the sacrificial pattern comprises an amorphous carbon layer.

4. The method of claim 1, wherein the isolation layer comprises an oxide-based layer and the sacrificial pattern comprises a photoresist layer.

5. The method of claim 1, wherein the isolation layer comprises an oxide-based layer and the sacrificial pattern comprises a stack structure including an amorphous carbon layer and a photoresist layer.

6. The method of claim 1, wherein etching the isolation layer in the peripheral region comprises performing a dry etch process.

7. The method of claim 1, wherein removing the isolation layer comprises performing a wet dip out process and a dry process.

8. The method of claim 7, wherein performing the wet dip out process comprises using one of: a buffered oxide etchant (BOE) and a hydrogen fluoride (HF) solution.

9. The method of claim 1, wherein removing the sacrificial pattern comprises performing a dry ashing process.

10. The method of claim 9, wherein performing the dry ashing process proceeds in one of: an oxygen ambience and an ozone ambience.

11. The method of claim 1, wherein the open regions are arranged in a zigzag pattern.

* * * * *